(12) United States Patent
Paz de Araujo et al.

(10) Patent No.: US 6,511,718 B1
(45) Date of Patent: *Jan. 28, 2003

(54) METHOD AND APPARATUS FOR FABRICATION OF THIN FILMS BY CHEMICAL VAPOR DEPOSITION

(75) Inventors: Carlos A. Paz de Araujo, Colorado Springs, CO (US); Larry D. McMillan, Colorado Springs, CO (US); Narayan Solayappan, Colorado Springs, CO (US); Jeffrey W. Bacon, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/446,226

(22) PCT Filed: Jul. 14, 1998

(86) PCT No.: PCT/US98/14531

§ 371 (c)(1),
(2), (4) Date: Dec. 17, 1999

(87) PCT Pub. No.: WO99/02756

PCT Pub. Date: Jan. 21, 1999

Related U.S. Application Data

(63) Continuation-in-part of application No. 08/971,799, filed on Nov. 17, 1997, now Pat. No. 5,997,642, which is a continuation-in-part of application No. 08/892,485, filed on Jul. 14, 1997, now Pat. No. 6,110,531.

(51) Int. Cl.$^7$ .......................... H05H 1/24; C23C 16/40; C23C 16/48; C23C 16/56; B05D 3/02; B05D 1/34

(52) U.S. Cl. .................. 427/576; 427/584; 427/529; 427/255.19; 427/255.32; 427/255.36; 427/255.25; 427/422; 427/376.2; 438/758; 438/778; 438/785

(58) Field of Search .................. 427/561, 562, 427/564, 565, 576, 529, 569, 584, 586, 255.31, 255.19, 255.29, 255.32, 255.25, 255.36, 422; 438/778, 785, 758, 376.2

(56) References Cited

U.S. PATENT DOCUMENTS 4,263,335 A * 4/1981 Wagner et al.
4,993,361 A * 2/1991 Unvala .................. 118/723

(List continued on next page.)

FOREIGN PATENT DOCUMENTS

| EP | 0 548 990 A2 | 6/1993 |
| EP | 0 736 613 A1 | 10/1996 |
| JP | 09195056 A * | 7/1997 |
| WO | WO87/07848 | 12/1987 |
| WO | WO89/07667 | 8/1989 |

*Primary Examiner*—Marianne Padgett
(74) *Attorney, Agent, or Firm*—Patton Boggs LLP

(57) ABSTRACT

A venturi mist generator creates a mist comprising droplets having a mean diameter less than one micron from liquid precursors containing multi-metal polyalkoxide compounds. The mist is mixed and then passed into a gasifier where the mist droplets are gasified at a temperature of between 100° C. and 250° C., which is lower than the temperature at which the precursor compounds decompose. The gasified precursor compounds are transported by carrier gas through insulated tubing at ambient temperature to prevent both condensation and premature decomposition. The gasified precursors are mixed with oxidant gas, and the gaseous reactant mixture is injected through a showerhead inlet into a deposition reactor in which a substrate is heated at a temperature of from 300° C. to 600 ° C. The gasified precursors decompose at the substrate and form a thin film of solid material on the substrate. The thin film is treated at elevated temperatures of from 500° C. to 900° C. to form polycrystalline metal oxide material, in particular, ferroelectric layered superlattice material.

25 Claims, 10 Drawing Sheets

U.S. PATENT DOCUMENTS

| | | | | |
|---|---|---|---|---|
| 5,120,703 A | * | 6/1992 | Snyder et al. | 427/561 |
| 5,309,071 A | * | 5/1994 | Karam et al. | 313/505 |
| 5,344,676 A | * | 9/1994 | Kim et al. | 427/468 |
| 5,439,845 A | * | 8/1995 | Watanabe et al. | 427/126.3 |
| 5,451,260 A | * | 9/1995 | Versteeg et al. | 427/248.1 |
| 5,508,226 A | * | 4/1996 | Ito et al. | |
| 5,540,959 A | * | 7/1996 | Wang | 427/561 |
| 5,555,219 A | * | 9/1996 | Akiyama et al. | 359/103 |
| 5,614,252 A | | 3/1997 | McMillan et al. | |
| 5,840,200 A | * | 11/1998 | Nakagawa et al. | 438/736 |
| 5,990,507 A | * | 11/1999 | Mochizuki et al. | 257/295 |
| 6,090,443 A | * | 7/2000 | Eastep | 427/255.32 |
| 6,337,032 B1 | * | 1/2002 | Chivukula et al. | 427/100 |

\* cited by examiner

METHOD AND APPARATUS FOR FABRICATION OF THIN FILMS BY CHEMICAL VAPOR DEPOSITION

This application is a continuation-in-part of U.S. patent application Ser. No. 08/971,799 filed Nov. 17, 1997, now U.S. Pat. No. 5,997,642, which itself is a continuation-in-part of U.S. patent application Ser. No. 08/892,485 filed on Jul. 14, 1997, now U.S. Pat. No. 6,110,531.

BACKGROUND OF THE INVENTION

1. Field of the Invention

The invention relates to methods for depositing high quality films of complex materials on substrates at high deposition rates, and apparati for effecting such methods. Particularly, the invention relates to enhanced chemical vapor deposition from liquid sources of high quality thin films of a large variety of complex metal-oxide compounds at high deposition rates, and apparati for effecting such methods. More particularly the invention relates to apparati and methods for fabricating high quality thin films of ferroelectric layered superlattice materials.

2. Statement of the Problem

There are known methods for depositing thin films of complex compounds, such as metal oxides, ferroelectrics, super-conductors, materials with high dielectric constants, gems, etc. Such known methods include RF sputtering, chemical vapor deposition ("CVD"), and spin coating. RF sputtering does not provide thin films of suitably high quality for practical integrated circuit uses, and it is hard if not impossible to control the stoichiometry so as to produce materials within the strict requirements of integrated circuit uses. Spin coating avoids the above defects of sputtering, but does not have good step coverage and suitably high fabrication rates for commercial uses. Present methods of chemical vapor deposition, while having good step coverage, are simply not able to form complex materials of suitable quality for integrated circuit use.

It has been recently discovered that certain layered compounds, referred to herein as layered superlattice materials (or layered superlattice compounds), are far better suited for use in ferroelectric and high dielectric constant memories than any prior art materials. These materials are highly complex, and no method is available to reliably fabricate high quality layered superlattice compounds in commercial quantities, at high deposition rates, and with step coverage that is suitable for making state-of-the-art integrated circuits. The application of known CVD methods to complex materials, such as layered superlattice materials, results in premature decomposition of the reagents and, often, a dry dust, rather than a solid material deposited on the substrate, or result in inferior quality materials that are not suitable for use as active components in an integrated circuit.

In conventional CVD methods, one or more liquid precursors are vaporized to the gaseous state using bubblers, in which carrier gas is bubbled through the liquid precursor. This process step requires that the precursor have sufficient volatility at the bubbling temperature to enable sufficient mass transfer rate for a commercially viable process. Even under good mass transfer conditions, however, the mass transfer rate is difficult to control accurately and precisely. When a plurality of liquid precursors are gasified, any uncontrolled variations in mass transfer rate and mass transport in the process streams result in fluctuations in product stoichiometry. Further, in order to vaporize, that is, gasify, sufficient quantities of liquid precursor at a commercially viable rate it is typically necessary to heat the liquid precursor during bubbling. But, the precursors used in the prior art are typically chemically unstable at the higher temperatures necessary to achieve sufficient mass transfer of the precursor from the liquid phase to the gaseous phase. As a result, premature decomposition of the chemical compounds contained in the precursor occurs. Premature decomposition causes undesirable, uncontrolled changes in the chemical stoichiometry of the process streams and the final product, as well as uneven deposition on the substrate in the CVD reactor. Premature decomposition, therefore, results in poor electronic and ferroelectric properties. Premature decomposition also leads to rapid fouling of the CVD-apparatus, necessitating frequent shut-downs for cleaning.

Another typical process for vaporizing liquid precursors in the prior art is to create a mist of small droplets by pushing the liquid through a needle syringe. The mist is usually injected directly into a deposition reactor. The temperature of the deposition reactor must be high enough to rapidly gasify the mist droplets. Such a procedure, however, does not produce a continuous stream, nor does it result in a stream comprising liquid droplets of small mean particle size with a narrow, controllable size distribution. The gasification of larger-sized liquid droplets requires higher temperatures, which inevitably leads to premature decomposition of the precursors. When the precursors decompose in the deposition reactor away from the substrate, they form particles on the substrate instead of a continuous, uniform film of material. Also, fouling of the apparatus occurs.

Still another conventional method of vaporizing the liquid precursor in a CVD process is to use an ultrasonic mist generator to form a mist of liquid droplets, and then transport the droplets into a heated zone of the deposition reactor itself to gasify the droplets at elevated temperature. It has been found that the ultrasonic mist generators add so much energy to the liquid precursors that they become chemically unstable and prematurely decompose. Also, the sizes of liquid droplets reated by the ultrasonic mist generators vary over a wide range and, therefore, are gasified at different rates. Finally, extra high temperatures are needed in the deposition reactor to gasify the liquid droplets, and the high temperatures lead to premature decomposition.

A common feature of CVD processes and apparati in the prior art is the failure to sufficiently mix misted precursors and gas-phase reactants to ensure desired control of reaction conditions in the CVD and control over the stoichiometry and quality of the deposited thin film. Also, the liquid precursors in the prior art have low vapor pressures, and they tend to decompose at the high temperatures necessary for gasifying them.

It would be helpful to have a method, an apparatus, and liquid precursors for fabricating thin films in integrated circuits in a commercially viable manner that would allow good control of stoichiometry in the deposited thin film, avoid the problem of premature decomposition, and provide the advantages usually associated with CVD processes, such as good step coverage and uniform film quality.

3. Solution to the Problem

The invention solves the above problems by providing methods, precursors, and apparati for the chemical vapor deposition ("CVD") of thin films of metalorganic compounds, particularly precursors of layered superlattice materials, that avoid premature decomposition of the reagents, provide easily controlled composition and flow rate of a gas phase reactant stream to the CVD reactor, and result in a thin film containing small grains having mixed orientation and good electrical properties.

The invention provides at least one liquid precursor containing at least one complex metalorganic compound.

The invention provides a multi-step gasification (or vaporization) process, comprising: production of a mist of each liquid precursor by a venturi mist generator; and rapid, low-temperature gasification of the mist in a separate gasifier. Preferably, the mists of each liquid precursor are combined and mixed in a separate mist mixer before gasification.

The invention provides a method and an apparatus for forming a mist using a venturi mist generator. The mist generator produces a mist of variable, controllable mass flow rate, comprising droplets of narrow, controllable size distribution. The mist droplets have a mean droplet diameter of less than one micron, and preferably in the range of 0.2 to 0.5 micron. Because the mass flow rate and chemical composition of the mist is known, it is possible to deposit a thin film of uniform, desired composition and stoichiometry.

The invention provides for a venturi mist generator comprising a variable gas inlet passage and a variable gas passage throat. The invention also provides for a venturi mist generator comprising a variable liquid inlet passage and a variable liquid passage throat. Such variability allows more flexible control of mass flow rate and mist droplet size.

The invention provides a method and apparatus for combining and mixing the mist streams exiting venturi mist generators. In this way, the invention provides a well-mixed mist that maintains uniform, desired stoichiometry of reagents in the mixed mist stream entering the gasifier.

The invention provides for a gasifier in which the liquid reagents contained in the mist droplets in a flowing mist stream are gasified quickly at low temperature before entering a deposition reactor, thus avoiding premature decomposition at elevated temperature during gasification. This is possible because the droplets, being small, have a large surface to volume ratio and are moving at a finite velocity in the carrier gas through the gasifier. As a result, heat transfer to the liquid and mass transfer of liquid to gas are enhanced. The enhanced heat transfer rate enables the latent heat of vaporization, required to gasify the liquid droplets in the mist, to transfer to the liquid at a temperature below the ranges in which substantial premature decomposition of the reagents could occur. The enhanced mass transfer increases the rate at which a given mass of liquid molecules can move into the gas phase, thereby reducing the time period of gasification during which the precursor reagents are held at elevated temperature. It is an object of the invention to gasify liquid mist droplets at a temperature not exceeding 300° C. Preferably the mist droplets are gasified at a temperature in the range from 100° C. to 200° C.

Another aspect of the inventive venturi-misting and subsequent low-temperature gasification of precursor liquid droplets is the use of low-volatility reagent compounds, which otherwise would not be usable in a CVD process because of the inability of the prior art to gasify the reagents at low temperature at a rate sufficiently fast for commercial fabrication.

The invention provides for flowing the gasified precursor through insulated tubing at ambient temperature, thus avoiding condensation by cooling, and premature decomposition of reagents by heating to elevated temperature The invention provides for mixing gasified precursor and oxidant gas in a mixing chamber or an oxidant mixer at low temperature before they enter the interior space of the deposition reactor. This results in a well-mixed reactant gas achieved at low temperature to avoid premature decomposition of the reagents.

It is an object of the invention to cool the interior space of the deposition reactor so that the reactant gas does not prematurely decompose at unnecessarily high temperatures.

The invention is useful for fabrication of thin films of ceramics, glasseous materials, electrically-active materials, including ferroelectric materials and high dielectric constant materials from liquid sources including sol-gel or MOD formulations. Preferably the liquid sources comprise metal alkoxide compounds. The invention in particular provides a method of fabricating an integrated circuit having at least one ferroelectric layered superlattice thin film. Preferably the integrated circuit is a non-volatile memory.

The invention provides liquid precursors containing metal moieties in effective amounts for forming layered superlattice material, in particular, ferroelectric layered superlattice material.

The invention provides for CVD precursors utilizing methoxides, ethoxides, butoxides, propoxides and other alkoxide compounds with which CVD precursors may be made for almost any layered superlattice material. Preferably the invention uses a multi-metal polyalkoxide reagent. Compared with other metalorganics used in CVD, the polyalkoxides have high volatility, good chemical stability, and high decomposition temperatures.

Another aspect of the invention is the use of multi-metal polyalkoxide precursors containing a plurality of chemical constituents of the desired thin film in order to reduce the total number of liquid precursors.

The invention provides a liquid precursor comprising a metalorganic compound dissolved in an organic solvent. The invention provides for a low volume fraction of solvent in a liquid precursor solution.

Preferably there is only one liquid precursor containing all reagents necessary for forming the desired thin film. If a plurality of liquid precursors is used to fabricate a layered superlattice material, preferably there is one metalorganic precursor containing superlattice generator atoms, and one multi-metal polyalkoxide precursor containing A-site and B-site atoms. Preferably, the metalorganic precursor contains a bismuth-containing metalorganic compound that reacts with a multi-metal polyalkoxide precursor to produce a bismuth-layered superlattice material. The preferred method provides for mixing all precursors used in the CVD process in a common solvent, such as tetrahydrofuran, prior to the misting step. In an alternative method, the invention provides for forming a mist of each liquid precursor separately, and then combining the separate mist streams and mixing them before gasification (vaporization).

In a preferred embodiment, the invention provides for a lead-containing organic precursor in order to produce a Pb-containing Bi-layered superlattice compound.

The invention provides for flowing the reactant gas comprising gasified precursor and oxidant gas through a showerhead injector towards the substrate. This results in a fresh supply of reactant gas of desired composition at the surface of the heated substrate, where it reacts. This enhances formation of a continuous thin film of solid material with uniform, desired stoichiometry.

The invention provides for decomposition of vaporized reagents and formation of the integrated circuit thin film in the deposition reactor on a substrate heated to a temperature in the range of 300 ° C. and 600 ° C. The thin film comprises material in an amorphous phase, a partially crystalline phase, or a polycrystalline phase. In particular, the invention provides for formation of a thin film containing metal moieties in effective amounts for forming layered superlattice material.

The invention provides for a treating process at elevated temperature after the thin film is formed on the substrate. In the preferred embodiment of the method, the thin film is crystallized or recrystallized in an oxygen furnace anneal step, typically at a temperature of from 500° C. to 900° C., preferably 750° C. In an alternative embodiment of the preferred method, a rapid thermal processing (RTP) anneal is conducted in addition to the oxygen furnace anneal. In the RTP anneal, the temperature is ramped over a range of from 1° C. per second to 300° C. per second and up to a temperature of from 500° C. to 850° C. for a holding period of from 3 seconds to 5 minutes. Preferably a combination of a furnace anneal and an RTP anneal is used. It is an object of the invention that treating the thin film of solid material results in a phase including more grains with a high polarizability orientation than prior to said step of treating.

The invention also optionally provides for an ion implantation step after the deposition of the thin film and prior to the treating process. This ion implantation step creates ion damage on the surface which provides a large number of crystallization nucleation points of different orientations.

The invention provides for depositing an electrode or electrical contact on the material, such as a layered superlattice material, followed by a second anneal, preferably a furnace anneal at from 600° C. to 900° C. for a period of 15 minutes or more.

Preferably each of the heating processes, that is, the deposition process at the substrate, the treating of the thin film (furnace and/or RTP anneal), and the second anneal after contact formation, takes place at the same or a higher temperature than the preceding treating step.

The invention provides for ion-coupled plasma (ICP) excitation of the reactant gas in the deposition reactor, which accelerates the rate of decomposition and reaction by overcoming kinetic barriers to reaction without adding heat to the reaction.

The invention provides for UV-irradiation of the reactant gas in the deposition reactor to enhance reagent decomposition and electronic properties of the deposited thin film.

The invention also includes a step of prebaking the substrate in an oxygen furnace at a temperature of between 500° C. and 1000° C. prior to performing the CVD deposition step.

The methods described above result in layered superlattice materials with good electronic properties, such as high polarizability, high dielectric constants, and low leakage currents. This is believed to be due to a crystalline orientation that results in good electronic properties.

DETAILED DESCRIPTION OF THE PREFERRED EMBODIMENT

Figure 1:
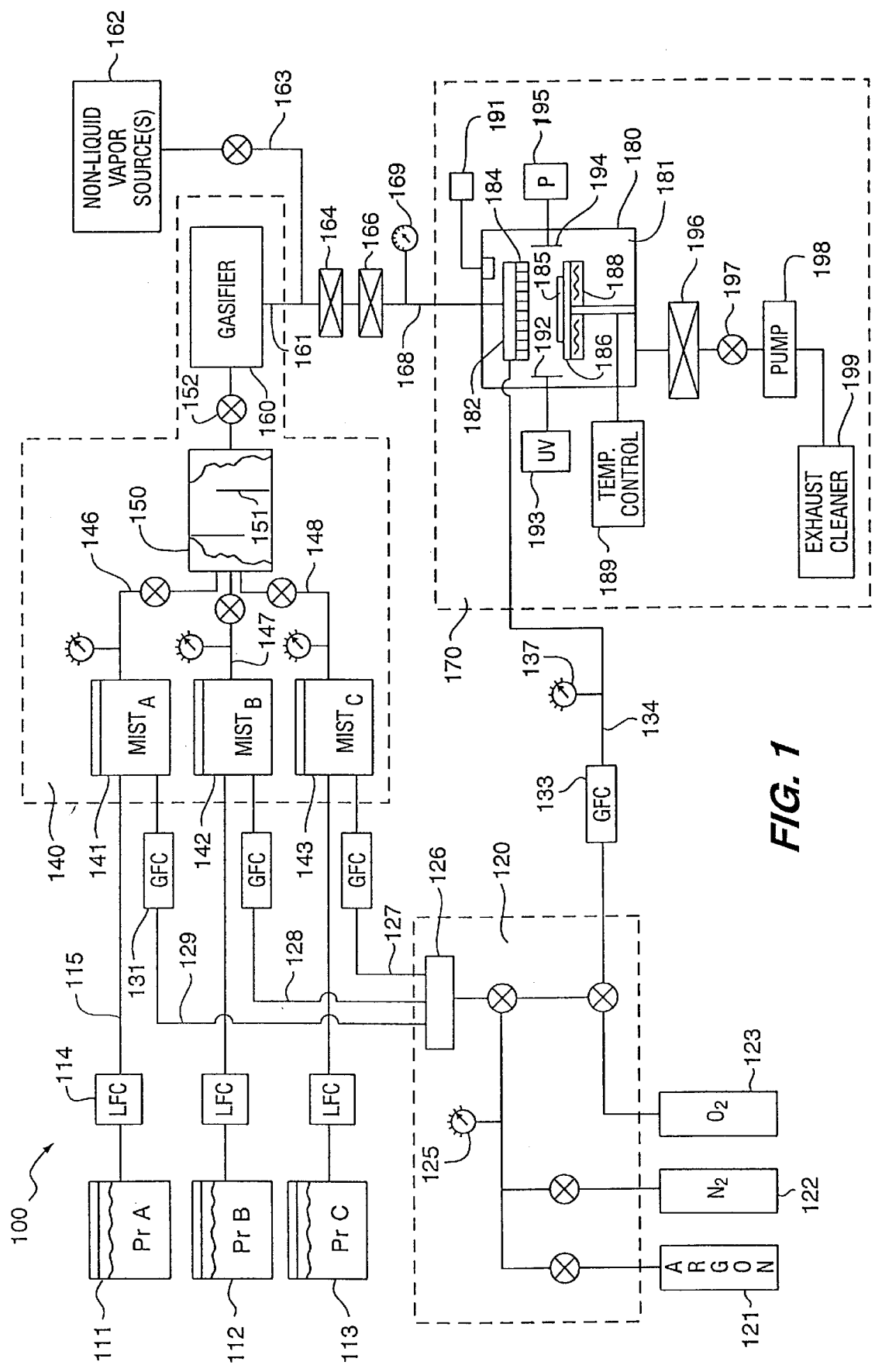
FIG. 1 is a schematic view of a CVD apparatus according to a first embodiment of the invention.

1. Overview and Description of the Apparatus

The term "thin film" herein means a thin film of a thickness appropriate to be used in an integrated circuit. Such thin films are less than 1 micron in thickness, and generally are in the range of 50 Å to 5000 Å. It is important to distinguish this term from the same term, i.e. "thin film" as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit, but are of no consequence in optics and other macroscopic arts.

The term "active" when applied to an electronic element in an integrated circuit, means an element that alters its state in response to some electrical stimulus. This is to distinguish elements that form important functions in the electrical circuit, and therefore must be of high, reproducible quality, and elements that are removed from the integrated circuit before its completion, which merely serve to separate portions of the circuit or act as a packaging element for the circuit, which elements do not need to be of nearly as high and reproducible quality.

The term "mist" as used herein is defined as fine droplets or particles of a liquid and/or solid carried by a gas. The term "mist" includes an aerosol, which is generally defined as a colloidal suspension of solid or liquid particles in a gas. The term mist also includes a fog, as well as other nebulized suspensions of the precursor solution in a gas. Since the above terms and other terms that apply to suspensions in a gas have arisen from popular usage, the definitions are not precise, overlap, and may be used differently by different authors. In general, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the terms aerosol or fog. The term mist is to be distinguished from a gasified liquid, that is, a gas. It is an object of this invention to use a venturi mist generator to create a mist from at least one liquid precursor in which the liquid mist droplets have a mean particle size of less than one micron diameter, preferably in the range 0.2–05 micron.

The terms "atomize" and "nebulize" are used interchangably herein in their usual sense when applied to a liquid, which is to create a spray or mist, that is, to create a suspension of liquid droplets in a gas.

The term "vapor" means a gas of a chemical species at a temperature below its critical temperature. The terms "vaporize", "vaporization", "gasify" and "gasification" are used interchangably in this specification.

In a typical CVD process, reagents necessary to form a desired material are usually prepared in liquid precursor solutions, the precursors are vaporized (i.e., gasified), and the gasified reagents are fed into a deposition reactor containing a substrate, where they decompose to form a thin film of desired material on the substrate. The reagent vapors can also be formed from gases, and from solids that are heated to form a vapor by sublimation. While an aspect of the invention includes the fact that such solid and/or gaseous sources may be incorporated along with vapors that have liquid sources to fabricate an integrated circuit material, the aspect of the invention that will primarily be discussed herein is the novel manner of processing the liquid precursor sources to obtain the gasified precursor utilized in the CVD process. That is, the solid and gaseous source aspects, except for their combination with the liquid sources of this disclosure, are known in the art and the details already discussed are sufficient for one skilled in the art to understand how to incorporate such solid and gaseous sources into the apparatus and methods of the invention.

As is conventional in the art, in this disclosure, the term "substrate" is used in a general sense where it includes one or a number of layers of material, such as 817 (FIG. 8), on which the thin film may be deposited, and also in a particular sense in which it refers to a wafer 851, generally formed of silicon, gallium arsenide, glass, ruby or other material known in the art, on which the other layers are formed. Unless otherwise indicated, it means any object on which a layer of a thin film material is deposited using the method and apparatus of the invention.

In the literature, there is often some inconsistent use of such terms as reagent, reactant, and precursor. In this application, the term "reagent" will be used a to refer generally to a chemical species or its derivative that reacts in the deposition reactor to form the desired thin film. Thus, in this application, reagent can mean, for example, a metal-containing compound contained in a precursor, a vapor of the compound, or an oxidant gas. Precursor refers to a particular chemical formulation used in the CVD method that comprises a reagent. For example, a precursor may be a pure reagent in solid or liquid or gaseous form. Typically, a liquid precursor is a liquid solution of one or more reagents in a solvent. Precursors may be combined to form other precursors. Precursor liquids generally include a metal compound in a solvent, such as metalorganic precursor formulations, sometimes referred to as MOD formulations, which typically comprise a metal alkyl, a metal-alkoxide, a beta-diketonate, combinations thereof, as well as many other precursor formulations. In the preferred embodiment of the invention, a multi-metal polyalkoxide is used. A metal polyalkoxide can be formed by reacting a carboxylic acid, such as 2-ethylhexanoic acid, with a metal or metal compound in a solvent. The preferred solvents include methyl ethyl ketone, isopropanol, methanol, tetrahydrofuran, xylene, n-butyl acetate, hexamethyl-disilazane (HMDS), octane, 2-methoxyethanol, and ethanol. An initiator, such as methyl ethyl ketone (MEK), may be added just before misting. A more complete list of solvents and initiators as well as specific examples of metal compounds are included in U.S. patent applications Ser. No. 08/477,111 and No. 08/478,398 both filed Jun. 7, 1995 which are hereby incorporated by reference to the same extent as if fully set forth herein.

A "gasified" precursor as used herein refers to gaseous forms of all the constituents previously contained in a liquid precursor, for example, vaporized reagents and vaporized solvent. The term "gasified precursor" refers to the gasified form of a single precursor or the gas-phase mixture of a plurality of precursors. The terms "reactant" and "reactant gas" in this application will generally refer to a gas phase mixture containing reagents involved in the deposition reactions occurring at the substrate plate in the deposition reactor, although the mixture logically includes other chemical species, such as vaporized solvent and unreactive carrier gas.

Preferably a liquid precursor contains a multi-metal polyalkoxide reagent, particularly to reduce the total number of liquid precursors to be misted, mixed, and gasified. Nevertheless, the use of single metal polyalkoxide precursors is fully consistent with the method and apparatus of the invention. All polyalkoxides are also "alkoxides". Multi-metal polyalkoxides are included within the terms "metal alkoxides" and "metal polyalkoxides". The terms "polyalkoxide", "metal polyalkoxide", and "multi-metal polyalkoxide" are, therefore, used somewhat interchangably in this application, but the meaning in a particular context is clear.

The term "premature decomposition" in this application refers to any decomposition of the reagents that does not occur at the heated substrate.

Premature decomposition includes, therefore, chemical decomposition of reagents in the mister/gasification system, in the process stream tubing, in the mixing chamber, and in the deposition reactor itself, if it is not at the heated substrate. Since it is known from the art of thermodynamics and chemical reaction kinetics that some premature decomposition will almost certainly inevitably occur to a slight extent even under optimum operating conditions, an object of the method and apparatus of the invention is to prevent "substantial premature decomposition".

Substantial premature decomposition occurs if premature decomposition causes the formation of particles of solid material on the substrate, in place of a continuous, uniform thin film of solid material. Substantial premature decomposition also occurs if premature decomposition causes fouling of the CVD apparatus that necessitates shutting down and cleaning the apparatus more frequently than once for every 100 wafers processed. An object of the method and apparatus of the invention is to process about 1000 wafers before shutting down the apparatus to clean it and service it. For example, if it were necessary to clean the system after depositing thin films on only 8–10 wafers, then this would indicate a problem of substantial premature decomposition.

FIG. 1 is a block diagram of the preferred embodiment of the CVD apparatus 100 according to the invention, showing a plurality of liquid precursor sources 111–113, and indicated by dashed lines, a gas manifold system 120, a mister/gasification system 140, and a deposition reactor system 170.

The liquid precursors shown as $Pr_{A-C}$ flow through liquid flow controllers 114 and the tubing of liquid flow lines 115 to the mister/gasification system 140. The mister/gasification system 140 comprises venturi mist generators 141–143, one for each incoming liquid flow stream in lines 115. Each venturi mist generator has a liquid inlet, a carrier-gas inlet, and a mist outlet. If only one liquid precursor is used in the method, then only one venturi mist generator is required. A carrier gas is delivered by gas delivery system 120 through gas manifold 126 in carrier gas lines 127–129 to each venturi mist generator used. The flow of gas is controlled by gas flow controllers 131. The inlet gas pressure of the carrier gas into each venturi mist generator is typically about 60–80 psig. The carrier gas is typically argon or nitrogen, with a flowrate on the order of one liter per minute. The settings of the mist generator and the inlet flow rates of liquid and carrier gas can be varied within ranges to produce a mist of desired droplet size and mass flow rate. Small droplet size in the mist enables the liquid droplets to be vaporized quickly at relatively low temperature to avoid substantial premature decomposition.

Mist generators 141–143 create a mist of small liquid droplets of liquid precursors in the carrier gas. If only one liquid precursor is being misted, then the venturi mist generator need not produce mist of desired quality from the liquid precursor with 100% efficiency. But, if a plurality of liquid precursors is being misted ("atomized", "nebulized"), then each venturi mister must produce a mass flowrate of liquid-droplets in the mist output stream that is equal to the liquid mass flowrate of the liquid inlet stream; otherwise control of overall stoichiometry would be practically impossible. The mist streams containing misted liquid precursor flow through mist lines 146–148 to combine in mist mixer 150, shown containing baffles 151, although other means may be employed for efficiently mixing the mist streams. The combined mist stream flows through connector 152 to gasifier 160. The liquid-phase precursor in the mist droplets is gasified at low temperature in gasifier 160. A combined "Atomizer/Vaporizer" unit comprising three venturi mist generators, a mist mixing zone, and a mist-gasification device is available from MSP Corporation, Minneapolis, Minn.

The gasified precursor stream flows from gasifier 160 through the insulated tubing of line 161 towards deposition reactor system 170. If other, non-liquid vapor sources are used, they are combined through line 163 with the gasified precursor stream in line 161. In an alternative embodiment (not shown), the non-liquid-source vapors are mixed with the mist in mist mixer 150. The temperature and pressure of the process streams being mixed are controlled to avoid substantial premature decomposition, on the one hand, and to avoid condensation of reagent vapors, on the other hand. The mister/gasification system 140 preferably is operated substantially at atmospheric pressure, that is in the absolute pressure range of 700–850 Torr. The chemical vapor deposition in deposition reactor 180 preferably is conducted at a partial vacuum in the range of about 1–200 Torr absolute pressure, preferably in the range 10–20 Torr. The gasified precursor stream flowing through line 161 towards the deposition system 170 is stepped down to the preferred lower operating pressure of deposition reactor 180 through step-down valves 164 and 166. The step-down in pressure is preferably conducted in at least two stages to avoid undesired condensation of the gasified precursor. If the pressure were stepped down too quickly in one stage, the sudden decrease in pressure and increase in gas volume could cause rapid cooling of the gas and result in condensation.

The gasified precursor stream at low pressure flows through the insulated tubing of line 168 into depostion reactor 180. A controlled amount of oxidant gas, typically oxygen, flows from oxidant gas source 123 through gas flow controller 133 and line 134 also into deposition reactor 180. The oxidant gas in line 134 and the gasified precursor in line 168 are mixed in oxidant mixer 182, thereby forming a reactant gas comprising gasified reagents contained in the precursors, gasified precursor solvent, carrier gas, and oxidant gas. The resulting reactant gas flows through showerhead injector 184 into the interior space 181 of deposition reactor 180 towards the heated substrate 185, where it decomposes to form the desired thin film of solid material.

Liquid flow controllers, such as 114, gas flow controllers, such as 131 and 133, pressure gauges, such as 137 and 169, and valves, such as 197, measure and control the flow of liquid and gas through the system, thereby controlling the stoichiometry of the deposited thin film. Conduit lines, such as 115, 129, 134, 146, and 168, carry the mist and gases throughout the system. The conduit lines are preferably stainless steel tubing, and preferably insulated, to prevent undesired cooling.

Energy is supplied to the deposition reaction system 170 by the substrate heater 188, located in substrate holder 186. Substrate temperature controller 189 controls electrical power to the substrate heating unit. The deposition reactor 180 may additionally receive energy from other reaction enhancement means, such as UV source 192 controlled by UV controller 193 and plasma-generator 194 controlled by plasma generator controller 195. An object of the apparatus and method is that the reagents not be unnecessarily exposed to elevated temperature until they react at the substrate surface. The invention provides for cooling of the interior space 181 of deposition reactor 180 by cooling unit 191. Vacuum pump 198 removes the undesired reaction by-products, principally organics, and any unreacted precursor, and assists in the movement of gasified precursor and oxidant gas into and through the showerhead injector 184. Cold trap 196 traps most of the materials exhausted from reactor 180 before they reach pump 198. Exhaust cleaner 199, which is preferably a gas absorber, removes any remaining reactants.

In the preferred embodiment of the inventive method, the precursors are mixed to form a single precursor prior to misting. If that is possible, then there will be only one liquid precursor solution, and only one precursor source, say precursor source 111, and one mist generator, i.e. mist generator 141, will be used in the process. If, for example, the material being made is a bismuth layered superlattice material, there will be a Bi-containing reagent and one or several metalorganic reagents dissolved in one solution and together containing all of the metals for forming the desired layered superlattice material. In some instances, there can be a common solvent, but the single precursor solution usually must be mixed "on the fly" just prior to misting. In that case, there will be two or more liquid precursor sources that are mixed in a liquid mixer manifold (not shown) just prior to misting, and only one mist generator is used (e.g., mist generator 141 in FIG. 1). It is most preferred that all precursor compounds, including additives, be mixed in one common solvent, and that the resulting precursor solution can be safely stored without reaction or decomposition for long periods. More typically, however, a plurality of liquid precursors are misted separately, the mists are combined and mixed to form a single, well-mixed mist stream, and then the mist mixture is gasified before entering the deposition reactor.

The gas sources preferably include an argon source 121, an oxygen source 123, and one or more sources 122 of other gases, such as dry nitrogen. Liquid flow controllers 114 control the flow of liquid precursors to the mist generators 141–143. Gas flow controllers 131 control the flow of carrier gas to the mist generators 141–143. Liquid sources 111–113 and gas sources 121–123 are arranged so that liquid from any one of liquid sources 111–113 and gas from any one of gas sources 121–123 can be directed to mist generators 141–143. Likewise gas flow controller 133 adjusts the flow of oxidant gas in line 134 so the proper amount of oxidant enters reactor 180. The precursors to be combined are placed in the liquid precursor sources 121–123, and are indicated generally in FIG. 1 as $Pr_A$, $Pr_B$, and $Pr_C$. The composition of the precursors will depend on the material it is desired to deposit; specific examples will be discussed in detail below. Generally it is preferred to have as low a solvent content as possible in the precursor solutions, thereby increasing the concentration of reagent solute in a liquid precursor solution. A typical molar concentration of reagent solute is about 0.2 molar. A concentration of 0.3 molar is considered high. Preferably the concentration of reagent in a liquid precursor is 0.5 molar or higher. The advantages of a low solvent content are: it reduces the total mass of precursor to be gasified; it reduces the flow of mass and volume through the reactor; it increases the concentration of reagents at the heated substrate; and it reduces the mass and volume of the waste stream exhausted from the reactor.

Figure 2:
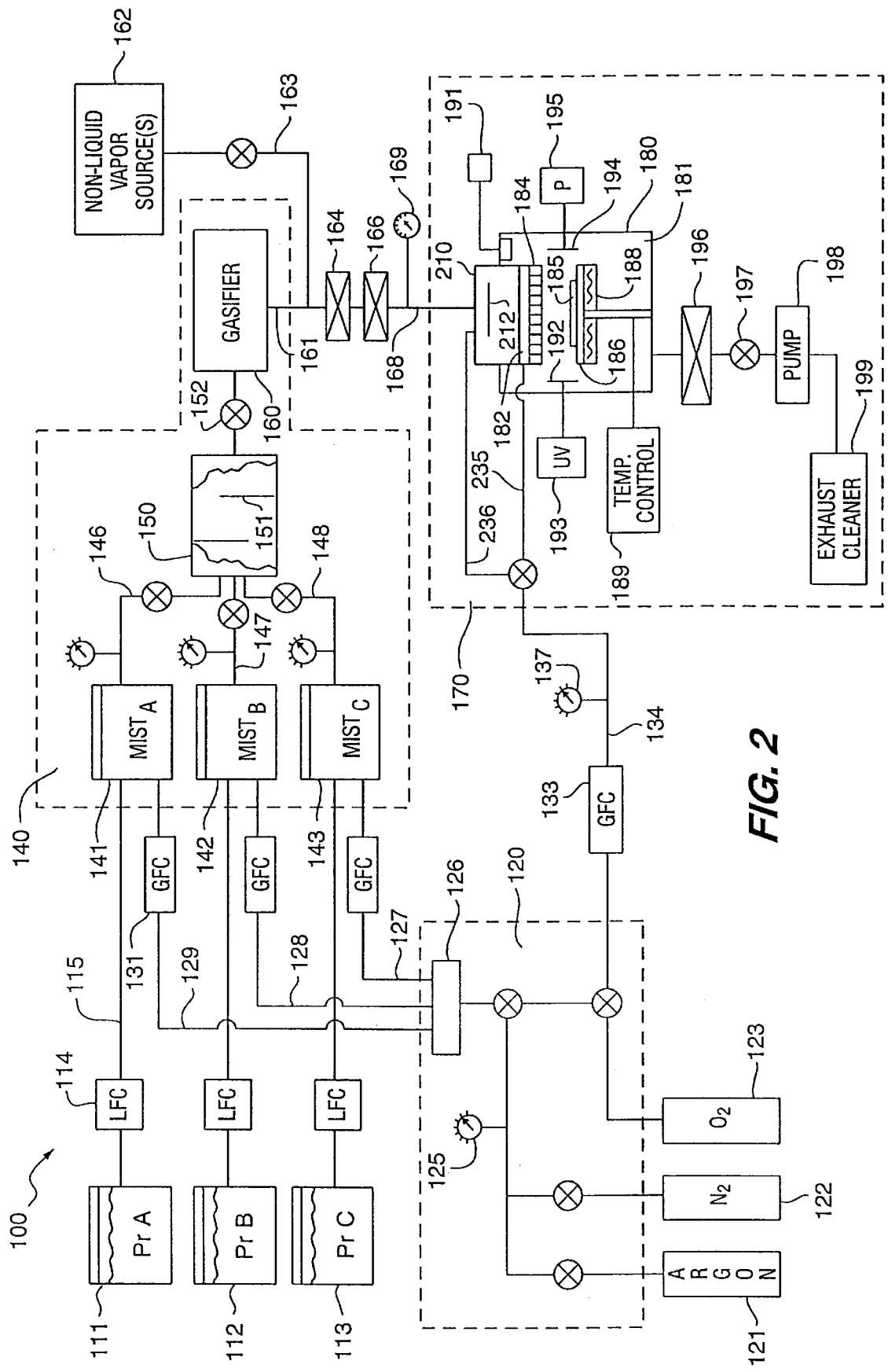
FIG. 2 is a schematic of a second embodiment of the invention.

FIG. 2 is a schematic of an alternative preferred embodiment of a CVD apparatus 200. In this embodiment, parts which are the same as parts in the embodiment of FIG. 1 are numbered the same, and will not be discussed again in detail. In this preferred embodiment of the invention, the gasified precursor stream in line 168 and oxidant gas from line 236 are mixed in a mixing chamber 210 before entering into the interior space 181 of deposition reactor 180. Mixing chamber 210 in FIG. 2 shows baffle 212, but other mixing means may be employed to effect efficient mixing, such as fixed or moving vanes or an elongated passage. Mixing chamber 210 is fluidically connected to showerhead injector 184. This embodiment allows the gasified precursor stream and the oxidant-gas reagent to form a well-mixed reactant gas at a temperature lower than the temperature in deposition reactor 180 just before the reactant gas flows through showerhead injector 184 towards substrate 185. In this embodiment, it is also possible to flow a portion of the oxidant into oxidant mixer 182, where it mixes with the reactant gas formed in mixing chamber 210 before flowing into the interior space 181.

In general, the mass flow rate of each reagent to the deposition reactor 180 depends on the concentration of the reagent in the liquid precursor solution and the rate of liquid mist transport from mist generator 114A–114C. Thus, to get the desired proportions and amounts of vaporized reagents into deposition reactor 180, each mist generator 141–143 will be operated at different conditions, and the flow of carrier gas to each of the mist generators 141–143 will be different. The misted precursor streams exiting from each mist generator 141–143 flow through lines 146–148 into mist mixer 150 where the streams are combined and mixed with the assistance of baffles such as 151, and thence to gasifier 160, where the small liquid droplets of the mist are gasified at low temperature. In the embodiments shown in FIGS. 1 and 2, the mist generators 141–143, the mist mixer 150 and the gasifier 160 are separate units, though they could be integrated as portions of the same physical unit, as in the Atomizer/Vaporizer unit of MSP Corporation, Minneapolis, Minn.

Figure 3:
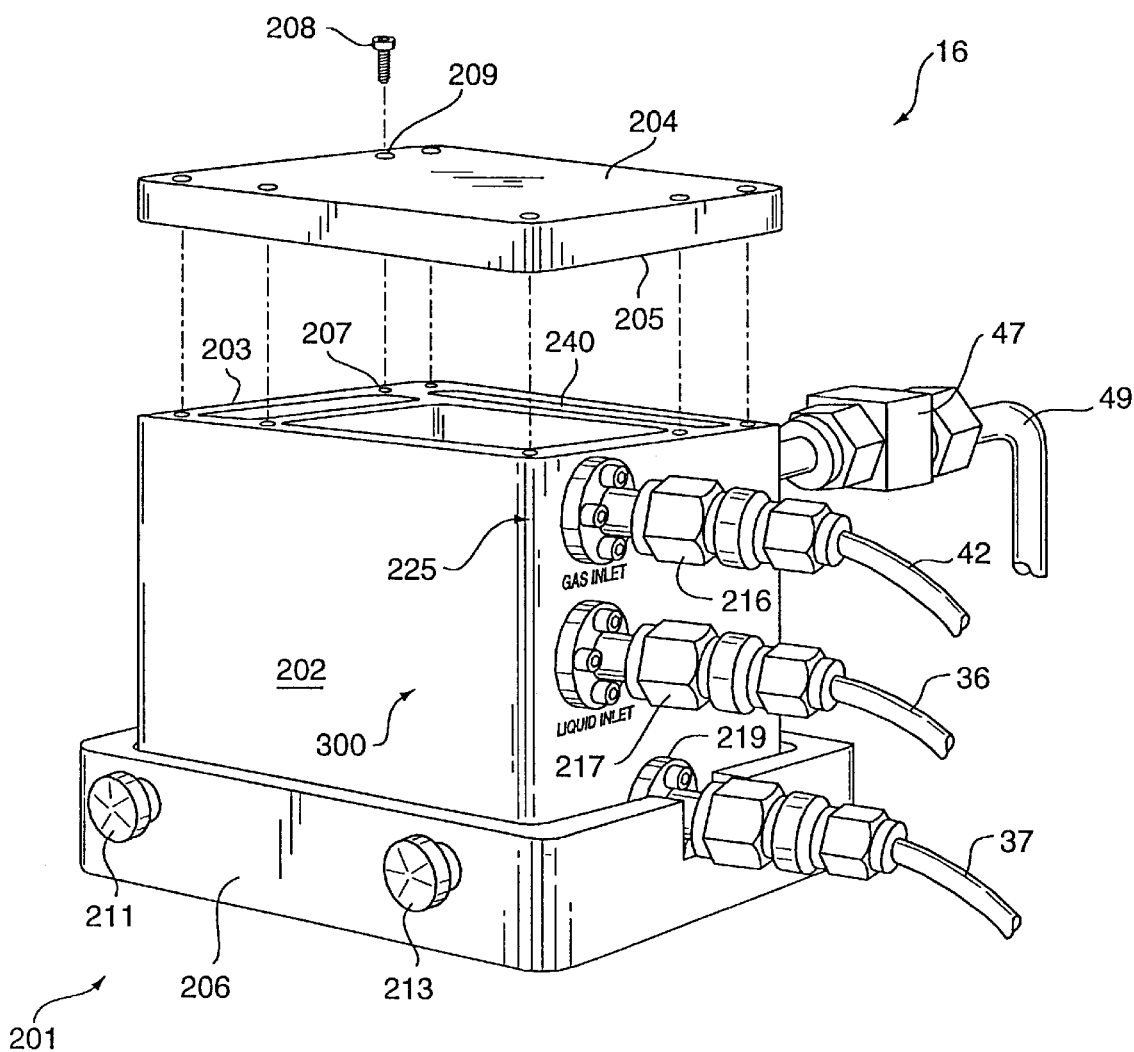
FIG. 3 is a perspective view of one embodiment of a mist generator according to the invention, namely a-nebulizer/refiner.

FIGS. 3–6 depict views of an embodiment 16 of a venturi mist generator for the preferred embodiment of the method and apparatus when a single liquid precursor contains all metal amounts necessary for forming the desired ferroelectric metal oxide. As depicted in FIG. 3, nebulizer/mist refiner 16 comprises a housing 201 having a body portion 202, a cover portion 204 and a base portion 206. Cover 204 attaches to body portion 202 with bolts 208 which screw through threaded bores 209 in cover and screw into threaded bores 207 in body portion 202. The upper surface 203 of body portion 202 and the undersurface 205 of cover 204 are ground smooth so that they seal tightly when bolts 208 are tightened. Bolts 211 and 213 frictionally engage the lower side of body portion 202 to hold it in place. Base 206 is welded into an equipment rack (not shown). Each of liquid conduits 36 and 37 (liquid drain), gas conduit 42, and mist conduit 148 connects to housing body 202 via a sealed connector, such as 217. Alternatively this may be a micrometer valve with a knob that would be attached to a fine screw thread (not shown) that permits minute adjustments of the flow of precursor liquid into mist generator 16.

Figure 4:
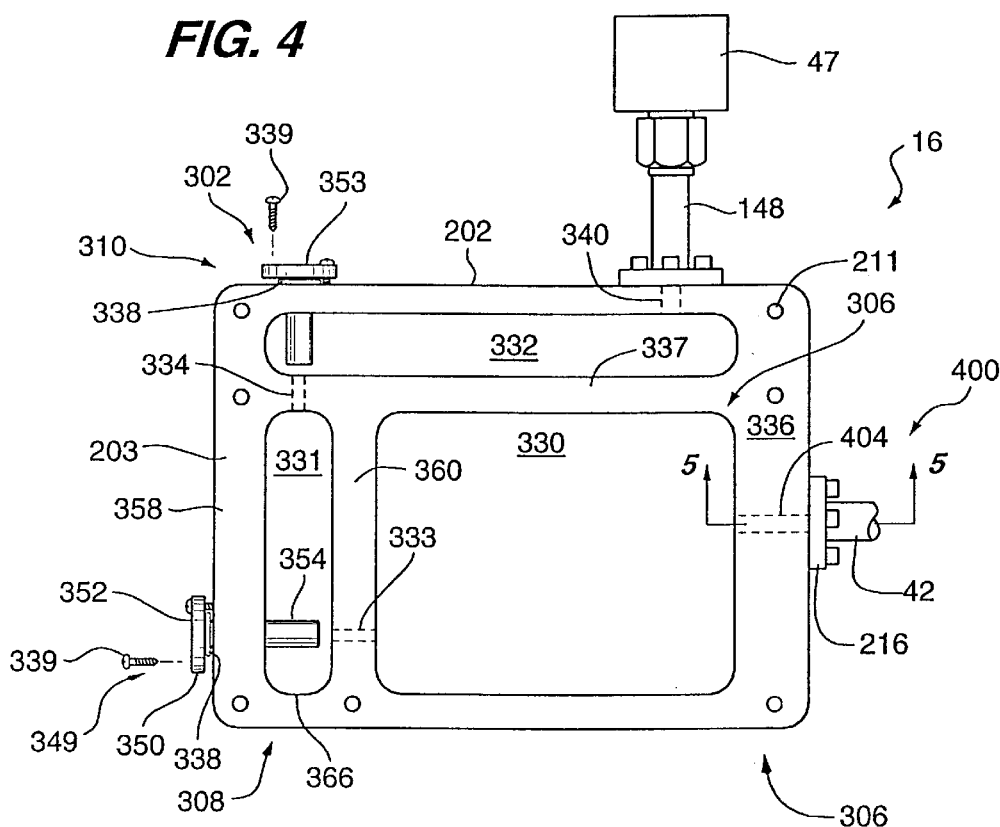
FIG. 4 is a plan view of the nebulizer/mist refiner of FIG. 3, with its cover removed.
Figure 5:
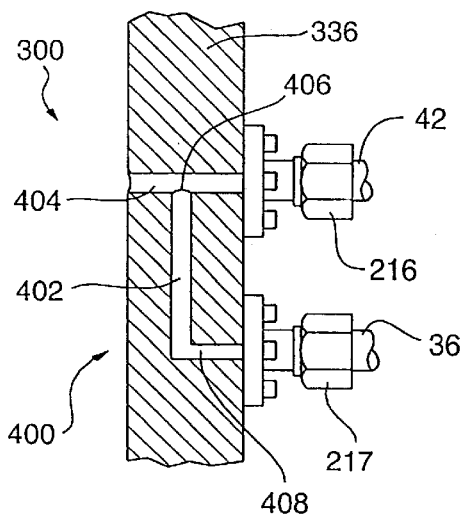
FIG. 5 is a cross-sectional view of the nebulizer through the line 5—5 of FIG. 4.
Figure 6:
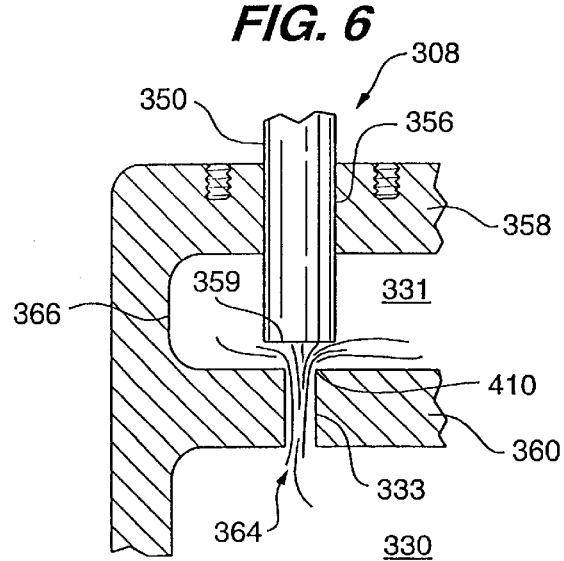
FIG. 6 is a cross-sectional view of the second-stage inertial separator of the mist refiner depicted in FIGS. 3 and 4.

As shown in FIG. 4, body 202 comprises a cube approximately five inches on a side, housing mist refiner 302, having three hollowed out chambers 330, 331, and 332. First chamber 330 is preferably roughly cubical and about three inches on each side, second chamber 331 is preferably oblong and about three inches long, ¾ inches wide and three inches deep. Third chamber 332 is also preferably oblong and about four inches long, ¾ inches wide and three inches deep. Chamber 330 houses the first stage 306 of mist refiner 302, chamber 331 houses the second stage 308 of mist refiner 302, and chamber 332 houses the third stage 310 of mist refiner 302. Passage 333 connects first chamber 330 with second chamber 331, passage 334 connects second chamber 331 with third chamber 332, and passage 340 connects third chamber 340 with conduit 148. As shown in FIG. 5, sidewall 336 of housing body 202 is about ½ inches thick and houses the nebulizer 400. FIG. 5 shows a cross-section through sidewall 336 and shows the nebulizer 400 in detail. Venturi-nebulizer 400 includes a liquid passage 402, which is preferably a capillary tube, and a gas passage 404 which meet at throat 406. Preferably, throat 406 is on the underside of gas passage 404, and liquid passage 402 lies beneath throat 406 so that liquid is pulled into passage 404 by the movement of the gas across throat 406. As indicated above, the gas enters passage 404 via conduit 42 and connector 216, while the liquid enters via conduit 36 and connector 217. Passage 404 is offset from the position of passage 333 to prevent streaming of mist droplets through chamber 330 directly from passage 404 to passage 333. That is, this arrangement permits the mist to equilibrilize in chamber 330 before passing on to the next stage of mist droplet refining.

Each stage of mist refiner 302 comprises an inertial separator, 306, 308 and 310. Inertial separator 306 includes the chamber 330 and the misaligned passages 404 and 333. In this embodiment of the inertial separator, any overly large mist droplets will strike wall 360 and stick. The liquid from the droplets that stick to wall 360 will collect in chamber 330. It should be understood that whether any given droplet will stick to wall 360 or some other part of the mist refiner 302 is statistical in nature. While the statistical probability that a droplet will stick increases as the size and mass of the droplet increases, it is still a probability. Thus, some droplets larger than a given size may make it through the mist refiner without sticking, while others smaller than the given size may stick. However, overall, when considering a large number of droplets with a distribution of sizes, the largest of the droplets will tend to be filtered out by the mist refiner 302, and as a result the distribution of droplets will shift to a distribution corresponding to a smaller mean droplet size.

The second-stage inertial separator 308 is shown in FIG. 4 and in a cross-sectional detail in FIG. 6. Stage 308- comprises chamber 331, passage 333, and separator piston assembly 349. Separator piston assembly 349 preferably comprises a piston 350, including a head 352 and a stem 354, an O-ring 338 that fits in a groove between head 350 and wall 358, and four screws, such as 339, that pass through bores in head 352 and screw into threaded holes in wall 358. Stem 354 fits snugly in bore 356 (FIG. 6) in wall 358. The end 359 of piston 350 is preferably blunt, and most preferably substantially flat. The nebulizer/refiner system 16 includes several different pistons 350 having different length stems 354. Thus the position of the blunt end 359 from exit 410 of passage 333 can be adjusted by replacing one piston 350 with another piston having a stem 354 of a different length. Passage 333 is preferably a cylindrical bore of about 2 millimeters in diameter and is located in wall 360 directly opposite the end 359 of piston 350. That is, it is centered with respect to bore 356 in wall 358. The mist is collimated in passage 333. As indicated by the streamlines 364, the presence of the blunt piston end 359 opposite the passage 333 deflects the flow of mist droplets; more technically, it adds a radial vector to the flow of gas and mist droplets, i.e. causes the flow to change in direction of the radii of the circle circumscribed by the end 359 of separator piston 349. Again, the larger the droplet, the greater its mass and inertia, and the higher probability there is that it will strike and stick to the end 359. The droplets that stick to the end 359 will collect and drip off the end into chamber 331. Thus, the distribution of droplets is again shifted toward smaller droplet size. The closer the piston end 359 is to the exit 410 of passage 333, the more the droplets will have to alter their direction, and the greater will be the probability of droplets sticking to end 359, and the more droplets will stick. In addition, the range of droplet sizes that have a probability of sticking that is higher than a given probability will extend into smaller and smaller droplet sizes as the end 359 is moved close to the exit 410 of channel 333. Thus, the distribution of droplet sizes, i.e. the mean or average droplet size, may be selected by adjusting the position of the end 359 of stem 350. As the end 359 is adjusted closer to the end 410 of passage 333, the distribution of droplet sizes in the mist shifts to a smaller droplet size and a reduced mean and average droplet size. As the end 359 is adjusted away from the exit 410, the distribution of droplet sizes in the mist shifts toward a larger droplet size. Put another way, if the piston 350 is made longer, the mean and average droplet sizes in the mist decrease, and as the piston 350 is made shorter, the mean and average droplet sizes in the mist increase. Preferably, exit 410 is located far enough from the end wall 366 of chamber 331 and far enough from the top 203 of body 202 that the end wall 366 and the cover 205 do not significantly interfere with the flow around the end 359. The length of chamber 331 and the placement of the exit passage 334 at the end of chamber 331 located farthest from passage 333, prevents droplets from streaming from exit 410 through passage 334 without undergoing many collisions which tend to randomize the droplet velocity vectors. The structure and operation of third mist refiner stage 310 is the same as that of second stage 308, except for. minor and essentially immaterial differences, such as the slightly different length of chamber 332 and the relative placement of the exit passage 340 with respect to entrance passage 334.

Figure 10:
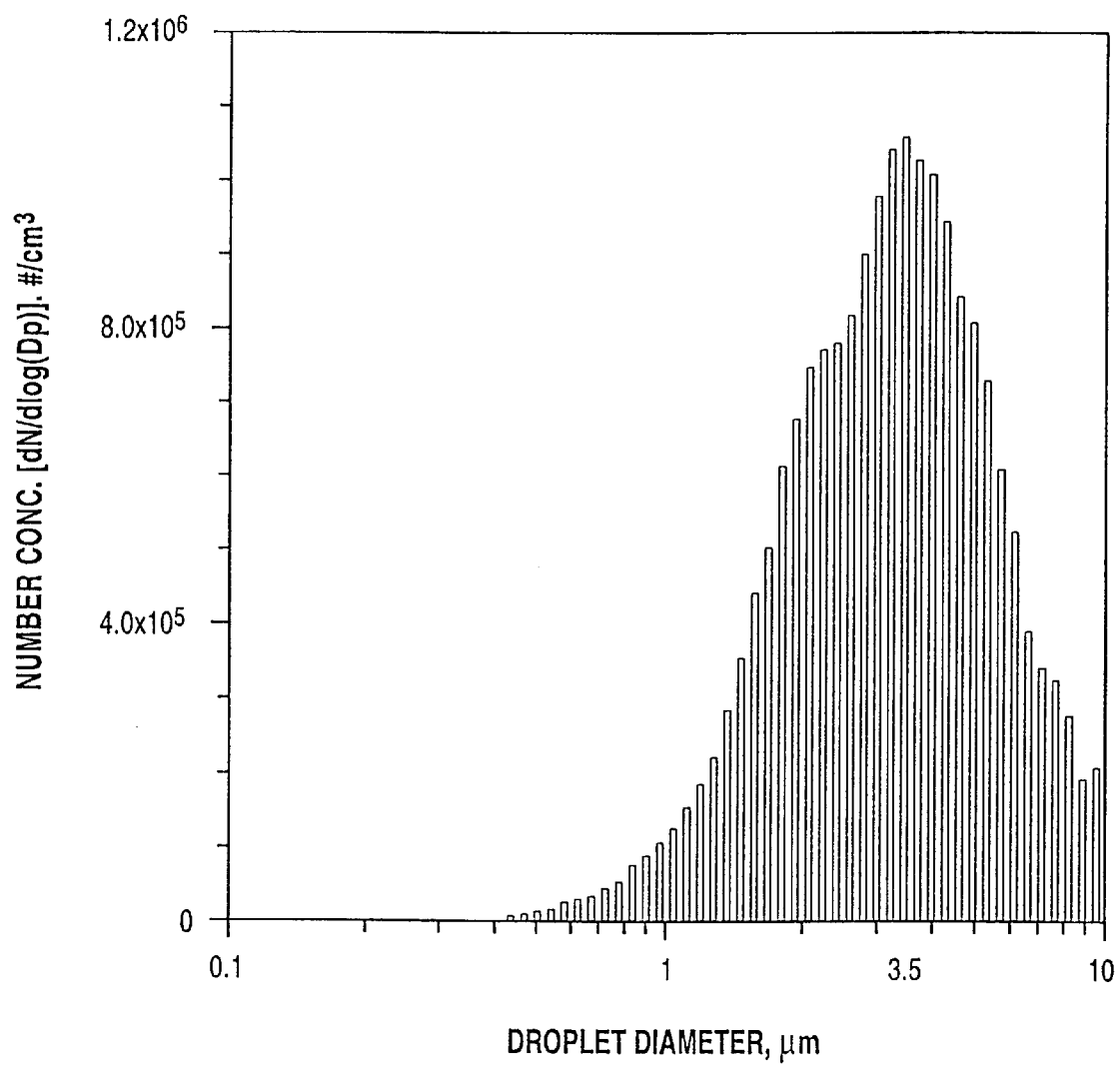
FIG. 10 is a graph of number concentration versus droplet diameter for a prior art mist generator.
Figure 11:
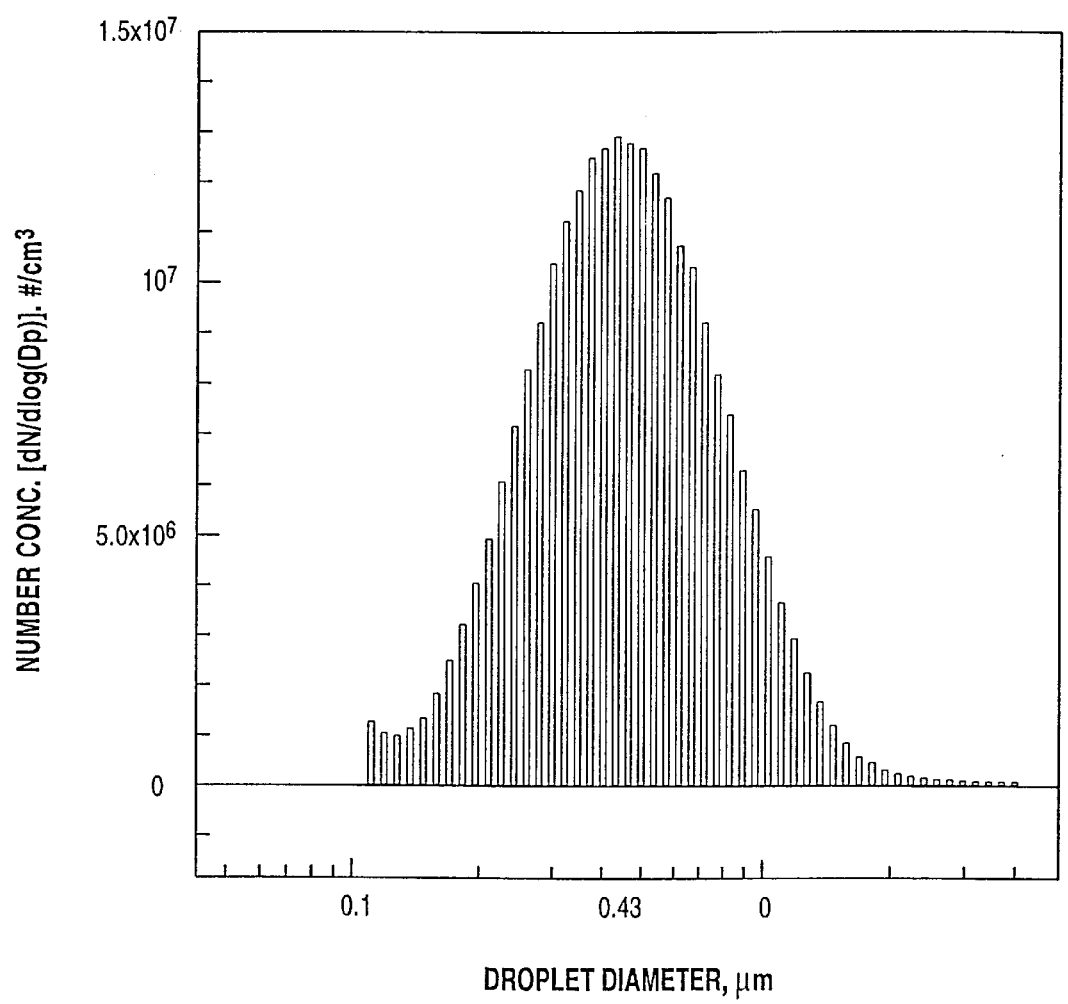
FIG. 11 is a graph of the anticipated number concentration versus droplet diameter of a mist to be produced by a nebulizer/refiner as depicted in FIGS. 3–6.

The mist droplets exiting nebulizer/refiner 16 preferably have a Gaussian distribution of droplet sizes, with a mean droplet size less than 1 micron, and preferably 0.5 microns or less. This is smaller than the droplet size in the prior art by more than a factor of 3. FIG. 10 shows a typical droplet size distribution obtained in the prior art, plotted as the droplet diameter in microns along the abscissa versus the number concentration of droplets in number per cubic centimeter (logarithimatically scaled). The approximately Gaussian function peaks at about 3.5 microns. It is antici- pated that a nebulizer/refiner as described above with reference to FIGS. 3–6 will produce a droplet size distribution similar to that shown in the graph of FIG. 11. Here, the curve peaks at about 0.43 microns. That is, the mean droplet diameter is about 0.43 microns. Experiments indicate that the anticipated distribution can be obtained using a gas conduit 42 of ¼ inch diameter and a about 1 millimeter diameter in both gas passage 404 and liquid passage 402. Experiments indicate that a peak at about 0.2 microns can be obtained using ⅜ inch diameter mist conduit 42, and about ½ millimeter diameter in both gas passage 404 and liquid passage 402.

Figure 12:
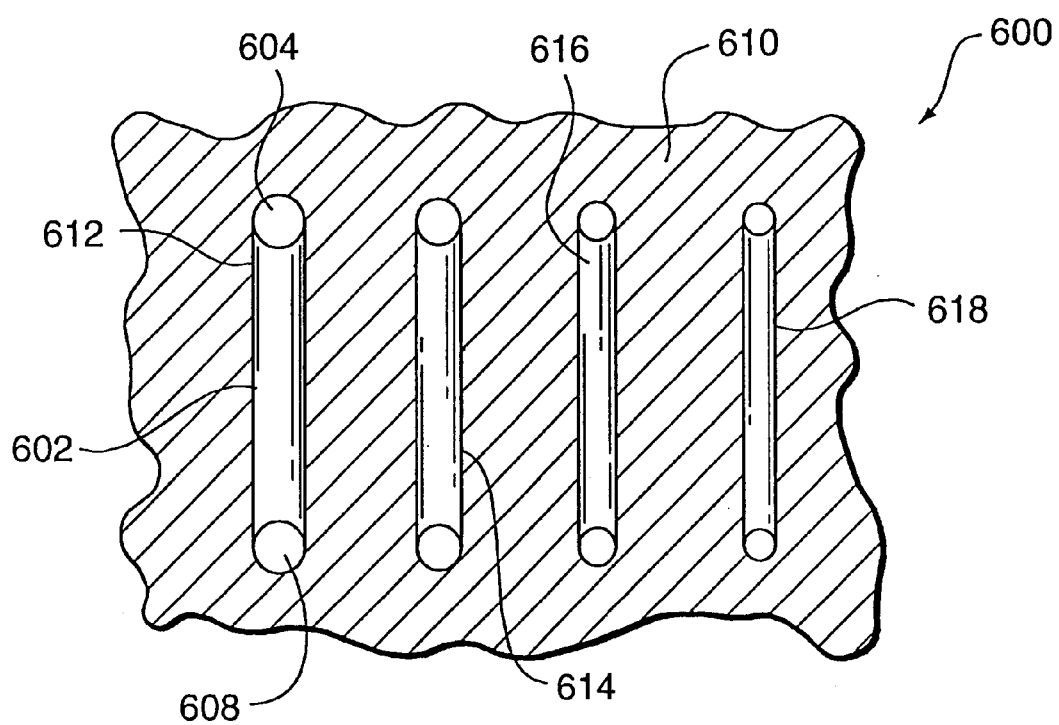
FIG. 12 is a cross-sectional view of an alternative embodiment of the nebulizer/mist refiner of FIGS. 3–6 in which the venturi throat diameters of the gas and liquid passages are variable.

FIG. 12 shows a cross-section of the preferred embodiment of a variable venturi nebulizer 600. This nebulizer 600 is similar to the nebulizer 400 (FIG. 5) in nebulizer/mister 16 except that it has four different venturi-misters, 612, 614, 616, and 618. Each venturi-mister includes a horizontal gas passage 604 (corresponding to gas passage 404 in FIG. 5), a vertical liquid passage 602 (corresponding to vertical liquid passage 402 in FIG. 5) which connects to a horizontal liquid passage 608 (corresponding to liquid passage 408 in FIG. 5). The size of the passages, such as 602, 604 and 608, is different in each venturi-mister 612, 614, 616, and 618. Preferably they vary from about ¼ millimeter to 2 millimeters in diameter. In the embodiment shown, the gas and liquid passages are of the same size in a particular venturi-mister, but this is not necessary, since they can be of different sizes. The different size of the passages in the venturi-misters result in different mass flow through each venturi-mister, allowing the user to have a different parameter, other than gas and liquid flow rates, that can separately be adjusted to adjust the flow of mist and the droplet size. The system 600 thus comprises a venturi nebulizer with an adjustable gas passage throat 604, 606 and an adjustable liquid passage throat 602, 606.

Figure 7:
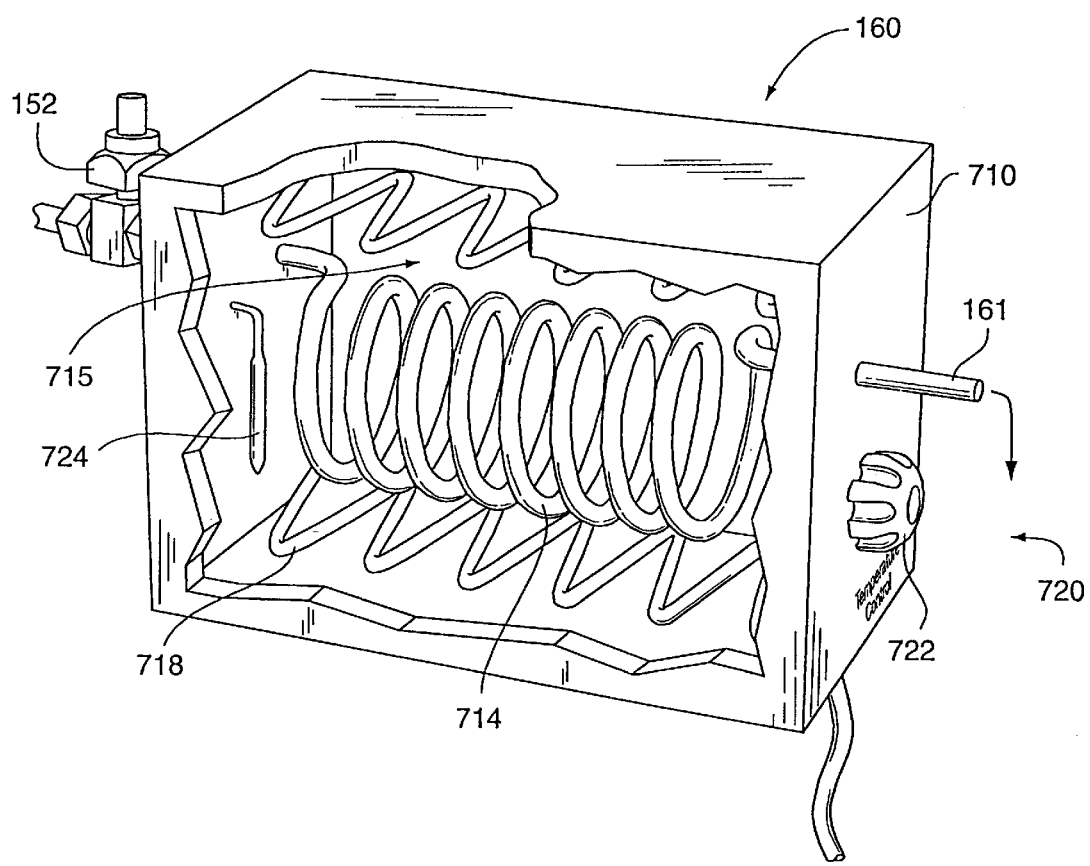
FIG. 7 is a partially cut away perspective view of an embodiment of a vaporizer according to the invention.

FIG. 7 depicts a partially cut-away perspective view of an embodiment of gasifier 160 according to the invention. Gasifier 160 comprises an insulated housing 710, a spiral mist conduit 714, a heating coil 718, a heating zone 715 proximal to said mist conduit 714, and a temperature control system 720 including a thermocouple 724 and a control unit 722. Spiral conduit 714 is preferably made of a stainless steel that conducts heat relatively easily. Conduit 714 connects to valve 152 at one end and to mist line 161 at the other. Temperature control system 720 is conventional and permits the temperature to be maintained in housing 710 at a temperature of between 50° C. and 300° C. Preferably the temperature within housing 710 is maintained in the range of 100° C. to 200° C.

Figure 8:
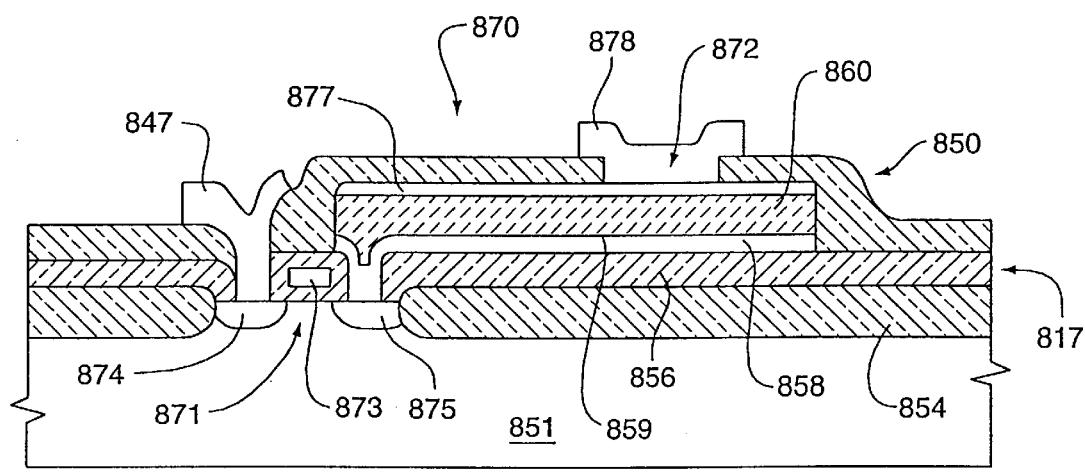
FIG. 8 is a cross-sectional view of an exemplary integrated circuit as may be fabricated by the process of the invention showing a memory cell of a non-volatile ferroelectric memory.

FIG. 8 shows an example of the integration of a thin film, 860, such as a layered superlattice material 860, into a memory cell 850 to form an integrated circuit 870, such as may be fabricated using the invention. The memory cell 850 preferably includes a silicon substrate 851, field oxide areas 854, and two electrically interconnected electrical devices: a transistor 871 and a capacitor 872. If the thin film 860 is a dielectric material, then the memory cell 850 is a DRAM memory cell, and if the thin film 860 is a ferroelectric material the memory cell 850 is an FeRAM memory cell. Transistor 871 includes a gate 873, a source 874, and a drain 875. Capacitor 872 includes first electrode 858, thin film 860, and second electrode 877. Insulators, such as 856, separate the devices 871, 872, except where drain 875 of transistor 871 is connected to first electrode 858 of capacitor 25 872. Electrical contacts, such as 847 and 878 make electrical connection to the devices 871, 872 to other parts of the integrated circuit 870. A detailed example of the complete fabrication process for an integrated circuit memory cell as shown in FIG. 8, except for the process of fabricating the layer 860, is given in U.S. Pat. No. 5,466,629 which is incorporated herein by reference. The process for fabricating the layer 860 is discussed herein. Typically the layer 860 is a thin film of thickness of between 200 Å and 5000 Å. It should be understood that FIG. 8 depicting the integrated circuit 870 is not meant to be an actual cross-sectional view of any particular portion of an actual electronic device, but is merely an idealized representation which is employed to more clearly and fully depict the structure and process of the invention than would otherwise be possible.

2. Detailed Description of the Fabrication Process

Figure 9:
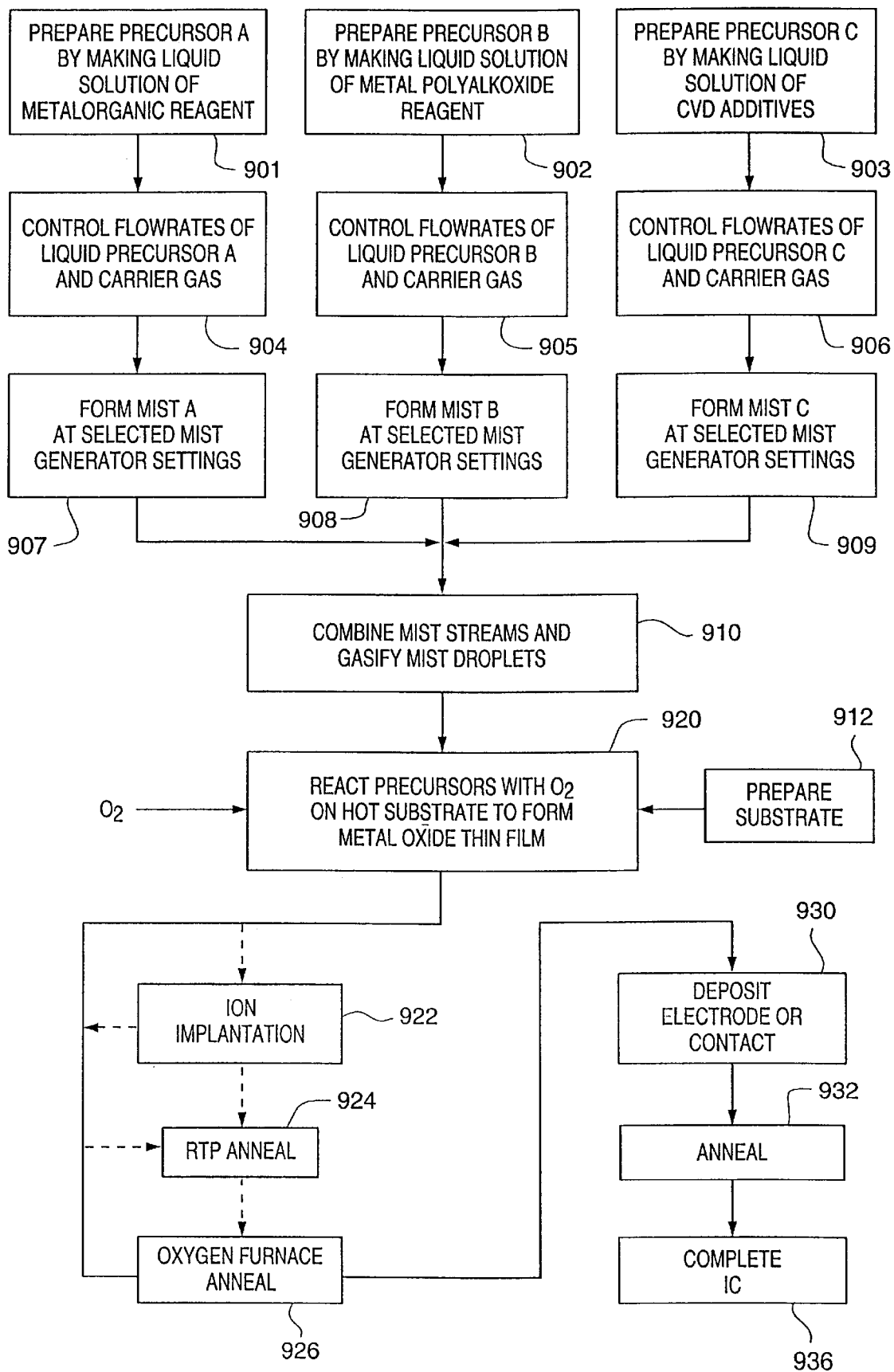
FIG. 9 is a flow chart showing the steps to produce a thin film in an integrated circuit in a typical CVD method according to the invention.

FIG. 9 is a flow chart of the preferred embodiment of a CVD process according to the invention for preparing a thin film of a layered superlattice material 860. The first steps 901–903 of the process involve the preparation of the precursors, $Pr_A$, $Pr_B$ ... $Pr_N$. The CVD reagent is formed by reacting the metal with an organic reactant to form a metalorganic compound. In many cases, the organic reagent is readily available commercially. In other cases, a commercially available intermediate compound of the metal may be reacted to form the desired reagent. In all cases, the preferred precursors are metalorganic liquids, so it may be necessary to dissolve solid reagents in a suitable solvent. Specific examples will be discussed below. Often the steps 901–903 may include several stages which may be separated considerably in time. In the first stage, the reagent may be dissolved in a suitable solvent and concentrated so as to provide a long shelf life. Just before use, the solvent may be distilled out. Or an intermediate compound of the metal that has a long shelve life may be prepared or purchased, and the final precursor formed by way of a reaction just prior to use. When the precursors are ready, they are transferred to the liquid precursor sources, such as 111–113 (FIG. 1), and are transported at controlled flow rates to the mist generators in steps 904–906, which make mists of the individual precursors in steps 907–909. The misted precursor streams are combined and gasified in step 910.

Substrate 817 is prepared in step 912, independently of steps 901–910. If the substrate is a metallized substrate, such as the substrate 817 in FIG. 13, then the substrate is prepared in step 912 by forming the layers 854, 856, and 858 on silicon wafer 851 and then prebaking the substrate. The prebaking step comprises baking in an oxygen furnace, typically at a temperature of between 500° C. and 1000° C., preferably at about 650° C. The substrate prebake removes water and organic impurities from the substrate surface and decreases the internal stress of the metal layer 858, thereby increasing the adhesion between the substrate 817 and the layered superlattice compound or other thin film 860. This prebake step is important for preparing electronic devices of high quality. If the substrate is a non-metallized substrate, such as a silicon or gallium arsenide single crystal, the substrate is dehydrated in step 912.

In step 920, a thin film 860 of metal oxides for forming layered superlattice material, an $ABO_3$ type metal oxide, or other material is deposited on the substrate 817 by one of the embodiments of the CVD apparatus described above in reference to FIGS. 1–8, 11–12. Typically the temperature of substrate 817 during deposition is between 300° C. and 600° C., preferably less than 500° C., the exact temperature depending on the material to be formed. The pressure in deposition reactor 180 is preferably between 10 Torr and 20 Torr. The vapor pressures of the individual precursor vapors depends on the precursor and will be discussed below in connection with the precursors. The film formed in step 920 contains all the metal elements of the desired metal oxide, in particular a layered superlattice material, and generally contains most but not all of the oxygen necessary to form the final desired material. It also may contain other organics from the precursor. It may be in an amorphous form, in a partially crystallized form, or in a form with a crystalline structure different from the final form desired. In steps 922 through 926 the film is treated to form the final desired layered superlattice material. Preferably the integrated circuit wafer 817 is removed from the deposition reactor before this treatment. This avoids the problem of possible contamination by materials on the walls of the reactor. The preferred essential treatment follows the solid lines in FIG. 9, while the dotted lines indicate preferred additional treatments. After formation in step 920, the thin film 860 is crystallized or recrystallized, preferably by a furnace anneal step 926, and most preferably by an RTP step 924 followed by furnace anneal step 926. The term crystallization or recrystallization is used because if the film is amorphous after step 920, then the furnace anneal and RTP treatments 926, 924 are a crystallization process, but if the film is polycrystalline after step 920, the process is a recrystallization process. For simplicity, in the discussion hereinafter, including the claims, wherever the term "crystallization" is used, it means both crystallization and recrystallization. The furnace anneal is performed at a temperature of from 500° C. to 900° C., preferably from 700° to 800° C., and most preferably at about 750° C., for from 15 minutes to three hours, and preferably for about 30 minutes. The RTP step is preferably at a temperature of from 500° C. to 850° C., and for from 3 seconds to 5 minutes, with a temperature ramping rate of from 1° C. to 300° C. per second, and most preferably at a maximum temperature of 725° C. with a ramping rate of 125° C. per second, a hold time of 30 seconds, and a natural cool time of 6 minutes, in an ambient oxygen flow of approximately 100–2200 cc/minute. Optionally an ion implantation step 922 may be performed prior to the RTP step 924 or furnace anneal step 926 to create crystallization sites. The ion implantation step 922 preferably employs implantation with argon, helium, oxygen or similar ions. This step creates additional nuclei for growing grains with mixed orientation. The RTP step also promotes nucleation, i.e. the generation of numerous small crystalline grains of the layered superlattice material of mixed orientation in the solid film 860. These grains act as nuclei upon which further crystallization can occur. The oxygen furnace anneal is particularly useful when the CVD formed film has significant oxygen deficiency. In addition to the advantages mentioned above, the steps 922 though 926 of treating the thin film 860 in general provide films of better stoichiometry than films that are not so treated. The ion implantation step, the furnace anneal, and the RTP step are preferably performed after removing the substrate 817 from the reaction reactor 129.

In step 930, the electrode 877, or other contact layer in the case of other embodiments, is formed by sputtering or other suitable process. Preferably the top or second electrode 877 is made of approximately 2000 Å of platinum. The integrated circuit wafer is then annealed in step 932. This anneal is preferably at the same temperature as the first furnace anneal step 926. Thus, in step 932 the anneal temperature is typically between 600° C. and 900° C., preferably 750° C., for a time period of 15 minutes or more. Usually this anneal time is 120 minutes or less, but longer times are sometimes required. The anneal step 932 releases the internal stress in the top electrode 877 and in the interface between the electrode 877 and the layered superlattice material 860. At the same time, the annealing step 932 reconstructs microstructure in the layered superlattice material 860 resulting from the sputtering of the top electrode, and as a result improves the properties of the material. The effect is essentially the same whether the anneal step 932 is performed before or after the patterning of the capacitor 872. The term "electrode or contact" is used above because in the integrated circuit shown, the layer 877 adjacent thin film layer 860 is an electrode, but in other embodiments, the term "contact" may be more appropriate, as for example when a wiring layer contacts the layered superlattice material directly. However, in their broadest meanings, the words "contact" and "electrode" are interchangeable, since electrode 877 also "contacts" the thin film 860. Hereinafter, for simplicity, the word "electrode" will be used when referring to this layer 877 through which electrical contact is made to thin film 860, with the understanding that it means any such "electrode" or "contact". The integrated circuit 870 is then completed in known processes in step 936.

It also should be noted that the invention contemplates that if the thin film 860 comprises a layered superlattice compound, it may be either a ferroelectric or a dielectric material, or both. That is, while in the preferred embodiment the layered superlattice material 860 is a ferroelectric, in other embodiments it may be a dielectric, or both a ferroelectric and dielectric. If it is a dielectric only, the capacitor 872 is a dielectric capacitor, and the integrated circuit 870 is a volatile memory.

It should be understood that the specific processes and electronic devices described herein are exemplary; that is, the invention contemplates that the layers in FIG. 8 may be made of many other materials than those mentioned above and described below, there are many other variations of the process of the invention than can be included in a document such as this, and the method and materials may be used in many other electronic devices other than the integrated circuit 870. It should also be noted that the word "substrate" is used in both a specific and a general sense in this disclosure. In the specific sense it refers to the specific silicon layer 851, conventionally called a silicon substrate, on which the exemplary electronic device 870 described is fabricated. In a general sense, it refers to any material, object, or layer on which another layer or layers are formed. In this sense, for example, the layers 851, 854, 856, and 858 comprise a substrate 817 for the layer 860.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material.

The crystallographic orientations of the layered superlattice material compounds are described herein in terms of a C-axis and an A-axis orientation. The C-axis is the crystal axis that passes through the planes of the alternating layers of the layered superlattice material. The A-axis is one of the four axes parallel to such planes. The definitions of the various axes, such as the A-axis and the C-axis, are known for layered superlattice materials. It is believed the good results of the process according to the invention arise from the fact that the process according to the invention yields grains oriented in a more mixed crystal phase rather than being predominately a phase that gives poor electronic properties. However, a complete crystallographic understanding of the layered superlattice materials made by the process of the invention has not yet been accomplished. Thus, it should be understood that while the process of the invention results in better electrical properties than the processes of the prior art, the reasons given herein for the good properties may change when a more complete crystallographic understanding of these materials is obtained.

The apparatus and process of the invention is very useful for forming a wide variety of integrated circuit materials, for example metal oxides having the general formula $ABO_3$, such as barium strontium titanate, and layered superlattice compounds, such as strontium bismuth tantalate. Layered superlattice materials, alternatively referred to as layered superlattice compounds herein, are materials that spontaneously form into crystalline material having distinctly different layers. These compounds have a dual periodicity, which is the reason why they are termed "superlattices". They should be distinguished from compositional superlattices which are heterostructures, that is, they are artificial or forced superlattices, as compared to the layered superlattice compounds which spontaneously form superlattices. Layered superlattice materials may be summarized generally under the formula:

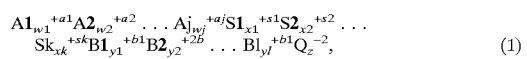

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+2b}\ldots Bl_{yl}^{+bl}Q_z^{-2}, \qquad (1)$$

where A1, A2 . . . A represent A-site elements in the perovskite-like structure, which may be elements such as strontium, calcium, barium, bismuth, lead, and others, S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which may be elements such as oxygen, fluorine, chlorine and hybrids of these elements, such as the oxyfluorides, the oxychlorides, etc. In this disclosure we are primarily interested in the layered superlattice oxides, which include the materials in which Q is oxygen as well as the hybrids that include oxygen. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by strontium atoms, and 25% of the A-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2\ldots+ajwj)+(s1x1+s2x2\ldots+skxk)+(b1y1+b2y2\ldots+blyl)=2z. \quad (2)$$

The layered superlattice materials do not include every material that can be fit into the formula (1), but only those which spontaneously form themselves into crystalline structures with distinct alternating layers.

It should also be understood that the term layered superlattice material herein also includes doped layered superlattice materials. That is, any of the materials included in formula (1) may be doped with a variety of materials, such as silicon, germanium, uranium, zirconium, tin or hafnium. For example, strontium bismuth tantalate may be doped with a variety of elements as given by the formula:

$$(Sr_{1-x}M1_x)Bi_2(Nb_{1-y}M2_y)O_9+\alpha M3O, \quad (3)$$

where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf, and preferably $0 \leq \alpha \leq 0.1$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x)\, SrBi_2Ta_2O_9+xABO_3, \quad (4)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

$$(1-x)\, SrBi_2Ta_2O_9+xABO_3,+\alpha Me0, \quad (5)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

A feature of the invention is that many different possible precursors may be used. Typical chemistry families that may be used as precursors are the alkoxides which include: methoxide $[M(OCH_3)_n]$, ethoxide $[M(OC_2H_5)_n]$, propoxide $[M(OC_3H_7)_n]$, and butoxide $[M(OC_4H_9)_n]$, where M is a metal and n is the number of alkoxy groups combining with the metal and is equal to the valence of the metal. Sometimes the use of a methoxide, for example, for one metal and the use of a propoxide, for example, for another metal gives better results than using compounds from the same family. A polymerized alkoxide can also be used for the CVD source. A preferable length of the alkoxide polymer chain is between 1 and 5 monomer units. Metal alkyls (e.g., diethyl lead) and beta-diketonates are other exemplary class of precursor compounds. Examples of beta-diketonates are acetylacetonate and benzoilacetonate.

As indicated above the layered superlattice materials may include metals such as strontium, calcium, barium, bismuth, cadmium, lead, titanium, tantalum, hafnium, tungsten, niobium zirconium, bismuth, scandium, yttrium, lanthanum and the lanthanides, antimony, chromium, molybdenum, vanadium, ruthenium and thallium. Some examples of precursors that may be used for some of these metals are given in Table I.

TABLE I

| METAL | PRECURSOR FORMULA | CHEMICAL NAME OR NAMES |
|---|---|---|
| Strontium | $Sr(DPM)_2$ | Dipivaloylmethanato strontium or Bis (2,2,6,6,-tetramethyl-3,5-heptanedionato)-strontium or strontium dipivaloylmethanate |
|  | $Sr(Cp)_2(THF)_2$ | Bis (pentamethyl-cyclopentadienyl)-bis (tetrahydrofran) strontium |
|  | $Sr(DPM)_2(Phen)_2$ | Bis (2,2,6,6-tetramethyl-3,5-heptanedionato)-bis (1,10-phenanthroline) strontium |
| Bismuth | $BiPh_3$ | Triphenyl bismuth |
|  | $Bi(OiPr)_3$ | Triisopropoxy bismuth |
|  | $Bi(DPM)_3$ | Bismuth dipivaloylmethanate |
| Barium | $Ba(DPM)_2$ | Barium dipivaloylmethanate |
| Lead | $Pb(DPM)_2$ | lead dipivaloylmethanate |
| Tantalum | $Pb(C_2H_5)_2$ | Diethyl lead |
|  | $Ta(OCH_3)_5$ | Pentamethoxy tantalum |
|  | $Ta(OC_2H_5)_5$ | Pentaethoxy tantalum |
|  | $Ta(OC_3H_7)_5$ | Pentapropoxy tantalum |
| Niobium | $TaCl_5$ | Pentachloro tantalum |
|  | $Nb(OC_2H_5)_5$ | Pentaethoxy niobium |
|  | $NbCl_5$ | Pentachloro niobium |
| Antimony | $Nb(DPM)_2Cl_3$ | Dipivaloylmethanato trichloro niobium |
| Titanium | $Sb(OC_2H_5)_3$ | Triethoxy antimony |
|  | $Ti(OiPr)_2(DPM)_2$ | Diisopropoxy dipivaloylmethanato titanium |
| Zirconium | $Ti(OiPr)_4$ | Tetraisopropoxy titanium |
| Ruthenium | $Zr(DPM)_4$ | Zirconium dipivaloylmethanate |
|  | $Ru(DPM)_3$ | Ruthenium dipivaloylmethanate |

In Table I, DPM is $C_{11}H_{19}O_2$, usually called 2,2,6,6,-tetramethyl-3,5-heptanedione.

During CVD-fabrication of layered superlattice materials, the vaporized metalorganic reagents should be prevented from being pyrolized or reacting with other substances prior to deposition. On the other hand, the reagents should pyrolyze rapidly and homogeneously once they reach the surface of the substrate. In order to achieve this objective, the invention provides a preferred method of depositing a Bi(bismuth)-generated layered superlattice thin film on a substrate in which a Bi-containing organic compound and a multi-metal polyalkoxide compound are used as precursors. Compared to some of the classes of compounds listed in Table 1, for example, the beta-diketonates and metal alkyls, the decomposition temperatures of the metal polyalkoxides are higher, yet they have sufficiently high vapor pressure to form good thin films using CVD. It is, therefore, preferable in the inventive method to use a multi-metal polyalkoxide precursor, as represented by the following formula:

$$A_i(B_j((OR_{j1})(OR_{j2})\ldots(OR_{j6})))(B_k((OR_{k1})(OR_{k2})\ldots(OR_{k6}))) \quad (6)$$

In this formula, $A_i$ is a cationic element and at least one simple substance or a mixture selected from the group consisting of Ba, Bi, Sr, Pb, La, and Ca. $B_j$ and $B_k$ are cationic elements that are identical or different from each other, and also simple substances or mixtures selected from the group consisting of Ti, Zr, Ta, Mo, W, and Nb. $R_{j1}$, $R_{j2}, \ldots R_{j6}$, $R_{k1}$, $R_{k2}, \ldots R_{k6}$ are alkyl groups having carbons from 1 to 12.

The multi-metal polyalkoxide compound represented by formula (6) typically contains two or three kinds of metal elements, and thus, a Bi-layered superlattice material can be formed from the multi-metal polyalkoxide compound and a Bi-containing organic compound. As a result, the number of metalorganic reagents used as precursors can be reduced to two, compared to the case of a conventional technique, which uses three or more precursors, one for each metal in the thin film of layered superlattice material. Therefore, the process conditions can be controlled more easily, and a Bi-layered superlattice ferroelectric or high-dielectric thin film having a desired chemical composition can be formed with good reproducibility. This specification specifically refers to double-metal polyalkoxides; however, the discussion herein of these compounds is applicable also to multi-metal polyalkoxides containing three of more metals, as represented in formula (6).

The multi-metal polyalkoxide compounds are used in this invention because of the following other advantages: they can be easily synthesized, separated, and refined; and, they are more stable than other classes of precursors at elevated temperature, so they do not pyrolyze or react with other molecules. Use of such compounds enables precise control of the stoichiometry of the chemical elements in the deposited layered superlattice thin film. Examples of the metal elements ($A_i$) in the metal alkoxide precursor are Group IIa elements, including Sr and Ba, Group Ia elements, including Na and K, and Pb. Examples of the metal elements ($B_j$, $B_k$) are Fe, Ti, W, and Group Va elements, including Nb and Ta. The Bi-layered superlattice ferroelectric thin film obtained possesses excellent properties, including spontaneous polarizability, as a capacitor in a nonvolatile memory, especially when the metal elements ($A_i$) are Group IIa elements, including Sr and Ba, and the metal elements ($B_j$, $B_k$) are Group Va elements, including Nb and Ta. The alkyl groups of the alkoxy groups ($OR_{j1}$, $OR_{j2}$)...($OR_{j6}$, $OR_{k1}$, $OR_{k2}$... $OR_{k6}$ in formula (6) contained in the metal oxide precursor are typically alkyl groups having carbons from 1 to 5, more specifically, methyl groups, ethyl groups, isopropyl groups, tertiary butyl groups, and isopentyl groups. The six alkyl groups that coordinate with the metal elements ($B_j$, $B_k$) can be one kind, different from each other, or be classified in from two to five of the groups mentioned in the preceding sentence. Especially when the alkyl groups in the precursor (alkyl groups that coordinate with the metal element $B_j$ and alkyl groups that coordinate with the metal element $B_k$) are either ethyl groups or isopropyl groups, vapor pressure sufficient for chemical vapor deposition of a thin film is achieved at a relatively low temperature region (at most 250° C.).

The following compounds are examples of preferred double-metal polyalkoxide reagents suited for CVD deposition:

(1) $Sr[Ta(OiPr)_6]_2$
(2) $Sr[Nb(OiPr)_6]_2$
(3) $Ba[Ta(OiPr)_6]_2$
(4) $Ba[Nb(OiPr)_6]_2$
(5) $Sr[Ta(OiPr)_6][Nb(OiPr)_6]$
(6) $Ba[Ta(OiPr)_6][Nb(OiPr)_6]$
(7) $Sr[Ta(OiPr)_3(OEt)_3]_2$
(8) $Sr[Ta(OiPr)_3(OEt)_3][Ta(OiPr)_2(OEt)_4]$
(9) $Sr[Ta(OEt)_6]_2$
(10) $Sr[Nb(OEt)_6]_2$
(11) $Ba[Ta(OEt)_6]_2$
(12) $Ba[Nb(OEt)_6]_2$

In these examples, Et indicates an ethyl group and iPr indicates an isopropyl group. In this invention, one or plural species of metal alkoxide reagents can be used. These metal alkoxide reagents can be easily synthesized, separated, and refined. They gasify in a relatively low temperature region (130° to 230° C.) to provide a vapor pressure (at least 0.1 Torr) required in the CVD process. In addition, the reagents are stable and do not decompose while they are fed into the deposition reactor, and then they rapidly pyrolyze on the substrate, which is heated to 300° to 500° C.

Organic compounds containing Bi (bismuth) include trimethyl bismuth $Bi(CH_3)_3$, triethyl bismuth $Bi(C_2H_7)_3$, triphenyl bismuth, Bi-tertiary butoxide, Bi-tertiary pentoxide, and Bi-tertiary amyloxide. One or plural kinds of them can be used. Among them, Bi-tertiary butoxide and Bi-tertiary pentoxide will have a high vapor pressure in a low temperature region (at least 0.3 Torr at 100° C.). Therefore, the amount deposited onto the substrate can be controlled accurately in the CVD process. Also, the Bi-tertiary butoxide and Bi-tertiary pentoxide have alkoxy groups as the functional groups, like the polyalkoxide compounds represented in formula (6). Thus, their decomposition temperatures are similar to those of the multi-metal polyalkoxide precursors.

When an organic compound containing Pb is used, the CVD-process can produce at a low temperature a Pb-containing, Bi-layered ferroelectric superlattice thin film in which the remanent polarization is enhanced. The reacting gas comprises at least one element selected from the group consisting of Sr (strontium) and Ba (barium), and at least one element selected from the group consisting of Nb (niobium) and Ta (tantalum). In other words, this invention provides a method for producing a ferroelectric thin film of Pb-containing Bi-layered superlattice material (formula (7)) from a Bi-containing organic precursor, a Pb-containing organic precursor, and a polyalkoxide precursor represented by formula (8).

$$(Sr_aBa_bPb_c)Bi_2(Nb_xTa_y)O_9 \qquad (7)$$

where a+b+c=1, 0<c<1, x+y=2

$$(Sr_dBa_e)[(Nb_pTa_q)(OR)_6]_2 \qquad (8)$$

where d+e=1, p+q=1, R is $C_2H_5$ or $CH(CH_3)_2$.

In this way, the multi-metal polyalkoxide precursor represented by formula (8) remains stable, not decomposing when it is misted and vaporized for transport into the deposition reactor, and it decomposes rapidly and homogeneously on the heated substrate in the deposition reactor at a temperature of between 300° and 500° C. Therefore, the lead-containing Bi-layered superlattice thin film of formula (7) can grow stably.

The Pb-containing organic compounds generally used in CVD-processes can be used in this invention. Examples include: $PbMe_4$, $PbEt_4$, $PbEt(OCH_2CMe_3)$, $PbEt_3(OiPr)$, $PbEt_3(OtBu)$, $Pb(dpm)_2$, $Pb(tmhpd)_2$, $Pb(OtBu)_2$, and $Pb_4O(OtBu)_6$. Here, Me indicates a methyl group, Et is an ethyl group, iPr is an isopropyl group, tBu is a tertiary butyl group, dpm is a dipivaloymethanate, and tmhpd is 2,2,6-trimethylheptane-3,5-dionate. At least one of these compounds is used. The first five Pb-containing organic compounds listed above to which alkyl groups are directly coupled have acute toxicity. The next two compounds comprising β-diketonate can react prematurely with the alkoxide compounds (formula (6)) in the process stream leading to the deposition reactor before they assist the growth of the Bi-layered superlattice thin film. As a result, it is preferable that at least one of the latter two compounds, namely, Pb-tertiary butoxide and Pb-oxotertiary butoxide are used. Pb-tertiary butoxide is the most volatile compound among the Pb-alkoxides (it sublimates at 100° C. under vacuum)

and pyrolizes partially at low temperature to change into Pb-oxotertiary butoxide ($Pb_4O(OtBu)_6$). Pb-oxotertiary butoxide is preferable as a CVD reagent because it is more stable to heat and less volatile. Its pyrolytic temperature is in the range from 300° to 500° C., so it will not decompose prematurely in process streams before reaching the deposition reactor. Pb-oxotertiary butoxide can be synthesized as described by R. Papiernik et al. in *Polyhedron,* vol. 14, 1657 (1991).

The CVD methods used in this invention can include normal pressure CVD, vacuum CVD, plasma CVD, and optical CVD. Normal pressure CVD means that the precursors are pyrolyzed and deposited on the substrate under atmospheric pressure. In vacuum CVD, the same operation is carried out in a reduced pressure. Vacuum CVD is the preferred method. A feature of the inventive method is that the liquid precursors are misted and gasified at atmospheric pressure, but the deposition reaction in the deposition reactor is conducted at reduced pressure, in the range of 1–200 Torr, preferably in the range of 10–20 Torr absolute. In plasma CVD, the reagent vapor is plasma-excited to accelerate the growth reaction when the reagent vapor is pyrolyzed. In optical CVD, ultraviolet rays are irradiated to the pyrolytic atmosphere of the reagent vapor in order to accelerate the growth reaction.

The invention provides for generating mists of a plurality of liquid precursors; the separate streams of misted precursors are mixed and vaporized (gasified) in the gasifier just before entering the deposition reactor, where the reagents decompose and form a thin film containing the chemical elements necessary for forming a ferroelectric metal oxide. By this method, it is possible to control directly the stoichiometry of the atoms in the layered superlattice thin film by controlling both the relative concentrations of the precursor reagents during preparation of the solutions and the mass flow rates of the misted process streams. Each tiny droplet suspended in the mist exiting from a mist generator contains liquid with a composition identical to the composition of the liquid precursor solution entering the mist generator. The rate of misting in the mist generators can be varied and controlled accurately, so that the mass flow rate of each precursor and the stoichiometry of the deposited thin film can be controlled. The tiny mist droplets, which have a large surface to volume ratio, can be vaporized, i.e. gasified quickly at a low temperature in the gasifier immediately prior to entering the deposition reactor. This avoids the problem of substantial premature decomposition.

It is preferable to prepare a Bi-containing metalorganic liquid precursor solution and a multi-metal polyalkoxide liquid precursor solution. For example, a multi-metal poly-alkoxide liquid precursor can contain a single species of double-metal polyalkoxide; or, it can contain two different species of double-metal polyalkoxide; or, it may contain a single tri-metal polyalkoxide. Preferably, a liquid precursor also contains a lead. A more preferable embodiment comprises the preparation and. misting of a single precursor solution so that layered superlattice thin films can be formed from reagents that remain stable when dissolved in a common liquid solvent. This preferred method makes the control of reagent mass flow rate and thin film stoichiometry even easier. The organic solvents used to make a single precursor solution include hydrocarbons, nitroparaffins, organic sulfur compounds, alcohols, phenols, aldehydes, ethers, ketones, organic acids, amines, and esters. Such solvents can be used alone or as a mixture thereof. The solvent tetrahydofuran can be used alone or in a mixture with at least one other solvent from one of the above categories in order to obtain a single liquid precursor solution because the reagents of this invention generally dissolve well in tetrahydrofuran.

In some cases, the metal elements (e.g., Sr, Ta, and Nb) supplied by the metal alkoxide compound represented by formula (6) are insufficient to achieve the desired film stoichiometry. In such a case, the metal alkoxide reagent represented by formula (6) should be used with another alkoxide containing one of the metal elements of the metal alkoxide reagent, for example, a Sr-alkoxide, a Ta-alkoxide, or a Nb-alkoxide. In this case, it is preferable that the alkoxy groups of the alkoxide are identical to those of the metal alkoxide reagent represented by formula (6).

It is preferable that the precursor composition comprises 1 to 99 weight percent of the Bi-containing organic compound and 99 to 1 weight percent of the metal polyalkoxide compound.

It is preferable that each $R_{j1}$, $Rj_2$, ... $R_{j6}$, $R_{k1}$ 1, $Rk_2$, ... $R_{k6}$ of the metal alkoxide compound represented by formula (6) is at least one group selected from the group - consisting of an ethyl group and an isopropyl group. If the respective twelve alkoxy groups of the metal alkoxide compounds comprise ethoxy or propoxy groups, vapor pressure sufficient for film-forming by CVD-technique can be obtained in a comparatively low temperature region (typically less than 250° C.). As a result, the amount of the compound supplied onto the substrate can be controlled more easily, and the amount of the metal elements contained in the ferroelectric thin film (excepting Bi) can be controlled more accurately.

It is preferable that $A_i$ of the alkoxide group represented by formula (6) is Sr or Ba, $B_j$ is Nb or Ta, and $B_k$ is Nb or Ta, so that the obtained Bi-layered superlattice ferroelectric thin film has excellent characteristics as a capacitance insulating film for a nonvolatile memory.

It is preferable that the Bi-containing organic compound is at least one compound selected from the group consisting of Bi-tertiary butoxide or Bi-tertiary pentoxide. Since Bi-tertiary butoxide and Bi-tertiary pentoxide have high vapor pressure in a low temperature region (0.3 Torr or more at 100° C.), the amount of the compound supplied to the substrate surface can be controlled more easily, and the amount of Bi-contained in the ferroelectric thin film can be controlled more accurately.

It is preferable to prepare a precursor solution comprising the Bi-containing organic compound and another precursor solution comprising the at least one multi-metal polyalkoxide compound represented by formula (6) using organic solvents, and that the solutions are misted, vaporized, and injected into the deposition reactor in order to grow a Bi-layered ferroelectric thin film as in formula (1) on a substrate therein. The concentration of the Bi-containing organic compound and that of the metal alkoxide compound represented by formula (6) in the precursor solutions and resulting vapor stream are controlled to obtain a desirable Bi-layered ferroelectric composition.

In the alternative embodiment of the invention in which all precursors are mixed in a single organic solvent, the solvent preferably contains tetrahydrofuran. The Bi-containing organic precursors and the metal polyalkoxide precursors represented by formula (6) generally dissolve well in tetrahydorfuran, so that the precursors can be homogeneously dissolved in liquid solvent, and as a result, a more homogeneous Bi-layered ferroelectric stoichiometry can be achieved.

When lead is used in the alternative embodiment, the amount of the added Pb-containing organic precursor ranges from $1 \times 10^{-5}$ to 200 weight parts when the composition comprising the Bi-containing precursor and the metal polyalkoxide precursor is 100 weight parts.

It is preferable that the Pb-containing organic precursor is at least one compound selected from the group consisting of Pb-tertiary butoxide and Pb-oxotertiary butoxide.

It is preferable that the reactant gas is plasma-excited when the gas is reacting at the substrate, so that the decomposition of the vaporized reagent compounds is accelerated and the thin film can grow at a lower temperature. In addition, the excited state of the gas can be varied, and the orientation and the quality of the ferroelectric or dielectric thin film can be controlled.

In an alternative embodiment of the invention, ultraviolet rays irradiate the reactant gas in the interior space of the deposition reactor, so that the decomposition of the vaporized reagents is accelerated, the film can grow at a lower temperature, and better electronic properties (e.g., polarizability) can be achieved.

It is preferable that the substrate is a semiconductor. In the invention, it is possible to combine Bi-layered superlattice ferroelectric thin-film forming steps in the process of producing an integrated circuit, and devices such as a nonvolatile memory can be produced efficiently.

In an alternative embodiment of the invention, at least one solid precursor is sublimed to form a vapor of the reagent, and this vapor is subsequently mixed with other gas-phase reagents produced by misting and gasifying liquid precursors.

The deposition reactor is a conventional, cold-walled PE-MOCVD reactor. For example, a Model AIX 2400 MOCVD reactor, designed for processing 6" wafers (extendable to 8' wafers) is available from Aixtron Inc., Buffalo Grove, Ill.

It is a feature of the invention that after depositing by CVD, the layered superlattice material is treated at a temperature from 500° to 900° C. to crystallize it in a phase including more grains with a high polarizability orientation than prior to said step of treating. Here, a "high polarizability orientation" means that the grains are oriented in such a way that a field normal to the surface of the substrate will produce a higher polarizability than if the treatment had not been performed. As indicated above, the treatment may comprise oxygen furnace annealing, RTP, a second anneal after the contact to the layered superlattice material is formed, or combinations thereof. Optionally, ion implantation prior to treatment at elevated temperature creates additional nuclei for growing grains with mixed orientation.

There has been described a CVD process for making thin films of active elements in integrated circuits, particularly elements utilizing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the importance of gasifying the mist at relatively low temperatures prior to reaction of the gases has been disclosed, this inventive feature may be used in combination with many other CVD processes than those there is room to described herein. It is also evident that the steps recited may in some instances be performed in a different order. Or equivalent structures and process may be substituted for the various structures and processes described. Or a variety of different precursors may be used. Consequently, the invention is to be construed as embracing each and every novel feature and novel combination of features present in and/or possessed by the fabrication processes, electronic devices, and electronic device manufacturing methods described.

What is claimed is:

1. A method of fabricating an integrated circuit including a thin film, comprising steps of:
   providing a substrate in a deposition reactor;
   providing a liquid precursor containing a metal compound;
   forming a mist of said liquid precursor;
   gasifying said mist to form a gasified precursor without causing substantial premature decomposition of said metal compound; and
   reacting said gasified precursor and an oxidant gas in said deposition reactor to form said thin film on said substrate, said method characterized in that said mist of said liquid precursor comprises mist droplets having a mean droplet diameter less than one micron.

2. A method as in claim 1, further characterized in that said step of providing said liquid precursor comprises providing a multi-metal polyalkoxide precursor.

3. A method as in claim 1, further characterized in that said mean droplet diameter does not exceed 0.5 micron.

4. A method of fabricating an integrated circuit including a thin film, said method comprising:
   providing a substrate in a deposition reactor;
   providing a liquid precursor containing a metal compound;
   forming a mist of said liquid precursor;
   gasifying said mist to form a gasified precursor without causing substantial premature decomposition of said metal compound; and
   reacting said gasified precursor and an oxidant gas in said deposition reactor to form said thin film on said substrate, said method characterized in that said thin film comprises a ferroelectric layered superlattice material; wherein
   said liquid precursor comprises at least one multi-metal polyalkoxide compound containing at least two metals selected from the group consisting of strontium, calcium, barium, cadmium, lead, tantalum, hafnium, tungsten, niobium, zirconium, bismuth, scandium, yttrium, lanthanum, antimony. chromium, molybdenum, vanadium, ruthenium and thallium and said multi-metal polyalkoxide compound includes chemical elements in proportions represented by a formula of:

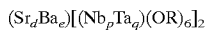

where d+e=1, p+q=1, R is $C_2H_5$ or $CH(CH_3)_2$.

5. A method as in claim 4, characterized in that said liquid precursor comprises a bismuth-containing organic compound selected from the group consisting of trimethyl bismuth ($Bi(CH_3)_3$), triethyl bismuth ($Bi(C_2H_7)_3$), triphenyl bismuth, Bi-tertiary butoxide, Bi-tertiary pentoxide, and Bi-tertiary amyloxide.

6. A method as in claim 4, characterized in that said liquid precursor comprises said metal compound dissolved in an organic solvent.

7. A method as in claim 6, characterized in that said organic solvent comprises tetrahydrofuran.

8. A method as in claim 4, characterized in that said ferroelectric layered superlattice material is a Bi-layered superlattice material.

9. A method as in claim 4, characterized in that said step of gasifying comprises heating at a temperature at which said metal compound does not substantially prematurely decompose.

10. A method as in claim 9, characterized in that said temperature is below 300° C.

11. A method as in claim 9, characterized in that said temperature is below 200° C.

12. A method as in claim 4, further characterized by treating said thin film at temperatures of from 500° C. to 900° C. to crystallize said thin film in a phase including more grains with a high polarizability orientation than prior to said treating.

13. A method as in claim 12, characterized in that said treating comprises annealing in an oxygen furnace.

14. A method as in claim 12, characterized in that said treating comprises rapid thermal processing (RTP) annealing.

15. A method as in claim 12, further characterized by performing an ion implantation step prior to said treating.

16. A method as in claim 12, characterized in that said treating comprises crystallizing said thin film in a mixed phase including both A-axis oriented grains and C-axis oriented grains.

17. A method as in claim 4, characterized by a step of plasma-exciting said gasified precursor and said oxidant gas, in said deposition reactor.

18. A method as in claim 4, characterized by irradiating said gasified precursor and said oxidant gas in said deposition reactor with ultraviolet rays.

19. A method as in claim 4, characterized by heating said substrate to a temperature between 300° C. and 600° C. during said reacting.

20. A method as in claim 4, characterized by a step of forming an electrode on said thin film.

21. A method as in claim 20, characterized by a step of annealing said thin film and said electrode in an oxygen furnace.

22. A method of fabricating an integrated circuit including a thin film, said method comprising:

providing a substrate in a deposition reactor;

providing a liquid precursor containing a metal compound;

forming a mist of said liquid precursor, gasifying said mist to form a gasified precursor without causing substantial premature decomposition of said metal compound; and reacting said gasified precursor and an oxidant gas In said deposition reactor to form said thin film on said substrate, said method characterized in that said thin film comprises a ferroelectric layered superlattice material;

said method characterized in that:

said gasified precursor contains an amount of a bismuth-containing organic compound and an amount of a metal polyalkoxide compound;

said gasified precursor comprises an amount of a lead-containing organic compound; and said layered superlattice material comprises a ferroelectric material represented by formula of:

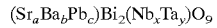

$(Sr_aBa_bPb_c)Bi_2(Nb_xTa_y)O_9$ where a+b+c=1, 0<c<1, x+y=2.

23. A method as in claim 22, characterized in that said amount of said bismuth-containing organic compound in said gasified precursor is between 1 and 99 weight parts and said amount of said metal polyalkoxide compound in said gasified precursor is 99 to 1 weight parts based on a combined amount of 100 weight parts of said amounts of said compounds.

24. A method as in claim 22, characterized in that said amount of said lead-containing organic compound in said gasified precursor is from $1 \times 10^{-5}$ to 200 weight parts when said amount of said Bi-containing organic compound and said amount of said metal polyalkoxide compound are a combined amount of 100 weight parts.

25. A method as in claim 22, characterized in that said lead-containing organic compound comprises a compound selected from the group consisting of Pb-tertiary butoxide and Pb-oxotertiary butoxide.

* * * * *